(12) United States Patent
Kim

(10) Patent No.: US 11,978,747 B2
(45) Date of Patent: *May 7, 2024

(54) TOUCH SCREEN PANEL FOR SENSING TOUCH USING TFT PHOTODETECTORS INTEGRATED THEREON

(71) Applicant: Hoon Kim, La Habra, CA (US)

(72) Inventor: Hoon Kim, La Habra, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/990,325

(22) Filed: Nov. 18, 2022

(65) Prior Publication Data

US 2023/0088505 A1 Mar. 23, 2023

Related U.S. Application Data

(63) Continuation of application No. 17/366,165, filed on Jul. 2, 2021, now Pat. No. 11,515,346, which is a
(Continued)

(51) Int. Cl.
| | | |
|---|---|---|
| *H01L 27/146* | (2006.01) | |
| *G02F 1/1333* | (2006.01) | |
| *G02F 1/13357* | (2006.01) | |
| *G06F 3/041* | (2006.01) | |
| *G06F 3/042* | (2006.01) | |
| *G06V 40/13* | (2022.01) | |

(Continued)

(52) U.S. Cl.
CPC ...... *H01L 27/1461* (2013.01); *G02F 1/13338* (2013.01); *G02F 1/133606* (2013.01); *G06F 3/041662* (2019.05); *G06F 3/04182* (2019.05); *G06F 3/0421* (2013.01); *G06V 40/1318* (2022.01); *H01L 27/14612* (2013.01); *H01L 27/14616* (2013.01); *H01L 27/14689* (2013.01); *H01L 31/036* (2013.01); *H01L 31/1136* (2013.01); *H10K 59/40* (2023.02); *G02F 1/13318* (2013.01); *H10K 59/60* (2023.02); *H10K 59/65* (2023.02)

(58) Field of Classification Search
CPC ............ G02F 1/13318; G02F 1/13338; G02F 1/133606; G06F 2203/04101; G06F 2203/04103; G06F 2203/04109; G06F 3/0412; G06F 3/041662; G06F 3/04182; G06F 3/0421; G06V 40/1318; H01L 27/14601; H01L 27/1461; H01L 27/14612; H01L 27/14616; H01L 27/14689; H01L 31/036; H01L 31/1136; H10K 59/40; H10K 59/60; H10K 59/65
See application file for complete search history.

(56) References Cited

U.S. PATENT DOCUMENTS

| | | |
|---|---|---|
| 11,094,724 B2 | 8/2021 | Kim |
| 11,646,330 B2 | 5/2023 | Kim |

(Continued)

*Primary Examiner* — Chun-Nan Lin

(74) *Attorney, Agent, or Firm* — Bryan Cave Leighton Paisner LLP

(57) ABSTRACT

A touch screen panel using a thin film transistor (TFT) photodetector includes a touch panel including a plurality of unit patterns for sensing light reflected by a touch by using a TFT photodetector including an active layer formed of (Continued)

amorphous silicon or polycrystalline silicon on an amorphous transparent material, and a controller configured to scan the plurality of unit patterns and read touch coordinates as a result of the scanning.

17 Claims, 18 Drawing Sheets

Related U.S. Application Data continuation of application No. 16/824,071, filed on Mar. 19, 2020, now Pat. No. 11,094,724.

(60) Provisional application No. 62/889,560, filed on Aug. 20, 2019.

(51) Int. Cl.
*H01L 31/036* (2006.01)
*H01L 31/113* (2006.01)
*H10K 59/40* (2023.01)
*G02F 1/133* (2006.01)
*H10K 59/60* (2023.01)
*H10K 59/65* (2023.01)

(56) References Cited

U.S. PATENT DOCUMENTS

| | | | |
|---|---|---|---|
| 2007/0229452 A1* | 10/2007 | Sano | G02F 1/1336 345/102 |
| 2016/0128653 A1 | 5/2016 | Fortuna et al. | |
| 2017/0337413 A1 | 11/2017 | Bhat et al. | |
| 2018/0032778 A1 | 2/2018 | Lång | |
| 2018/0069127 A1 | 3/2018 | Yang | |
| 2019/0027499 A1* | 1/2019 | Li | H01L 31/105 |
| 2019/0033976 A1 | 1/2019 | Cao et al. | |
| 2019/0311256 A1* | 10/2019 | Hack | H10K 59/60 |
| 2020/0050818 A1* | 2/2020 | He | G06V 40/1394 |
| 2020/0264728 A1* | 8/2020 | Qin | H01L 27/14609 |
| 2020/0373338 A1 | 11/2020 | Okhonin et al. | |
| 2020/0395421 A1* | 12/2020 | He | G06F 21/32 |
| 2020/0401269 A1* | 12/2020 | Reynolds | G06V 40/1359 |
| 2021/0050385 A1* | 2/2021 | Chuang | G06V 40/1318 |
| 2021/0055860 A1* | 2/2021 | Kim | H01L 27/14601 |
| 2021/0057599 A1* | 2/2021 | Kim | H01L 27/14616 |
| 2021/0335858 A1* | 10/2021 | Kim | H01L 27/14601 |
| 2022/0058362 A1* | 2/2022 | Lee | G06V 40/13 |
| 2023/0051302 A1* | 2/2023 | Wan | H01L 25/167 |

* cited by examiner

TOUCH SCREEN PANEL FOR SENSING TOUCH USING TFT PHOTODETECTORS INTEGRATED THEREON

CROSS-REFERENCE TO RELATED APPLICATIONS

This application is a Continuation of application Ser. No. 17/366,165, filed on Jul. 2, 2021, which is a Continuation of application Ser. No. 16/824,071, filed on Mar. 19, 2020 (now U.S. patent Ser. No. 11/094,724, issued on Aug. 17, 2021), which claims priority to U.S. Provisional Application No. 62/889,560 filed on Aug. 20, 2019, the contents of which are all hereby incorporated by reference herein in their entirety.

TECHNICAL FIELD

The present disclosure relates to a touch screen panel which senses a touch through thin film transistor (TFT) photodetectors integrated thereon.

BACKGROUND

Technologies such as liquid crystals, organic light emitting diode (OLED) cells, touch screens, backlights, and thin film transistors (TFTs) on glass are integrated on a display panel. Particularly, the trend of recent mobile devices is toward a display panel which tends to be as large as or larger than an overall device size, and a display itself is becoming more flexible.

However, the current display system performs only a one-way function of outputting an image or the like to the outside, without a function of efficiently, directly acquiring an input signal. At present, the display system executes only a touch screen function, with general performance.

A device for sensing a touch, such as a touch screen or a touch pad, is an input device attached to a display device to provide an intuitive input method to a user, and has been widely applied to various electronic devices such as a mobile phone, a navigation device, a tablet, and the like. Particularly, as the demands for smartphones increase, more and more touch screens are adopted as touch sensing devices which provide various input methods in a limited form factor. Along with this technological trend, the performance of touch screens is also growing.

The above information is presented as background information only to assist with an understanding of the disclosure. No determination has been made, and no assertion is made, as to whether any of the above might be applicable as prior art with regard to the disclosure.

SUMMARY

An aspect of the disclosure is to address at least the above-mentioned problems and/or disadvantages and to provide at least the advantages described below.

Accordingly, an aspect of the disclosure is to implement a high-sensitivity touch panel on a glass substrate or a flexible substrate such as a polyimide film, which is used as a touch screen panel, by a thin film transistor (TFT) fabrication technology.

Another aspect of the disclosure is to recognize a touch fast and accurately, using a touch screen panel having display pixels and a touch panel integrated thereon.

Another aspect of the disclosure is to perform touch sensing without the need for separately providing a light emitter for a touch panel, by using a light emitting device or backlight unit (BLU) of a display as a light source for the touch panel.

Another aspect of the disclosure is to implement a transparent touch panel capable of displaying and touch sensing by vertically stacking a display panel and a touch panel or arranging the display panel and the touch panel on the same panel.

Another aspect of the disclosure is to fabricate a switching TFT for display and a driving TFT for touch sensing in a single process by arranging a screen panel and a touch panel on the same panel.

Another aspect of the disclosure is to use a light source for a display also as a light source for a touch panel.

Another aspect of the disclosure is to use both of a BLU of a liquid crystal display (LCD) and a light emitting source of an organic light emitting diode (OLED).

Additional aspects will be set forth in part in the description which follows and, in part, will be apparent from the description, or may be learned by practice of the presented embodiments of the disclosure.

According to an embodiment of the disclosure, a touch screen panel using a TFT photodetector includes a touch panel including at least one unit pattern for sensing light reflected by a touch by using a TFT photodetector including an active layer formed of amorphous silicon or polycrystalline silicon on an amorphous transparent material, and a controller configured to scan the at least one unit pattern and read touch coordinates as a result of the scanning.

According to an embodiment of the disclosure, the touch panel may include a plurality of first unit patterns which are arranged in parallel with each other in a first direction, and a plurality of second unit patterns which are arranged in parallel with each other in a second direction crossing the first direction, insulated from the first unit patterns.

According to an embodiment of the disclosure, the controller may be configured to scan each of the first unit patterns by supplying a first voltage to the plurality of first unit patterns line by line, scan all of the plurality of second unit patterns by sequentially supplying the first voltage to the plurality of second unit patterns according to a first scanning control signal, each time each of the plurality of first unit patterns is scanned, connect to the first and second unit patterns of the touch panel, and detect a touch recognition signal indicating whether a touch has occurred, and a touch position by comparing a voltage of initial capacitance of each unit pattern with a voltage of current capacitance of the unit pattern, each time the first voltage is supplied to the plurality of first unit patterns and the plurality of second unit patterns by a driving circuit.

According to an embodiment of the disclosure, the controller may include a first driving circuit configured to scan the first unit patterns by supplying the first voltage to the first unit patterns, and a second driving circuit configured to scan the second unit patterns by supplying the first voltage to the second unit patterns.

According to an embodiment of the disclosure, the first driving circuit may include a plurality of first control switches configured to respectively supply the first voltage to the plurality of first unit patterns in response to a first scanning control signal and a second scanning signal from the controller, and a plurality of second control switches configured to respectively supply the first voltage to the plurality of second unit patterns in response to the first scanning control signal and the second scanning signal from the controller.

According to an embodiment of the disclosure, the controller may include a first integration processor including a first capacitor charged by a capacitance variation in a unit pattern, a comparator configured to compare a level of an output signal of the first integration processor with a predetermined reference level, and a noise canceller including a plurality of switches operating according to an output of the comparator. When the level of the output signal of the first integration processor is higher than the reference level, the comparator may control each of the plurality of switches to discharge the first capacitor.

According to an embodiment of the disclosure, the controller may further include a second integration processor including a second capacitor charged by the charged first capacitor, and a calculator configured to determine a touch input from an output signal of the second integration processor.

According to an embodiment of the disclosure, the noise canceller may include a first switch connected to a ground and a second switch connected to an input node of the second integration processor. When the level of the output signal of the first integration processor is higher than the reference level, the comparator may be configured to turn off the second switch and turn on the first switch.

According to an embodiment of the disclosure, the comparator may include a first comparison circuit configured to compare the level of the output signal of the first integration processor with a first reference level, and a second comparison circuit configured to compare the level of the output signal of the first integration processor with a second reference level. When the level of the output signal of the first integration processor is higher than the first reference level or lower than the second reference level, the comparator may operate each of the plurality of switches to discharge the first capacitor.

According to an embodiment of the disclosure, the touch panel may further include an infrared (IR) light source configured to cause diffused reflection on the transparent material by irradiating IR light from one side of the transparent material. The unit pattern may collect the IR light diffusedly reflected from a body contacting the transparent material, and the controller may process touch recognition along with positioning of the body by the light generated from the IR light source and then collected.

According to an embodiment of the disclosure, the touch panel may further include a backlight light source configured to irradiate backlight in a transmission direction of the transparent material through a space between adjacent TFT photodetectors. The unit pattern may collect the backlight passed through the transparent material and then reflected back from the body, and the controller may process touch recognition along with the positioning of the body by the light generated from the backlight light source and then collected.

According to an embodiment of the disclosure, the unit pattern may include the TFT photodetector including the active layer formed of amorphous silicon or polycrystalline silicon on an amorphous transparent substrate, and at least one transistor electrically coupled to the TFT photodetector and configured to generate a voltage output from photocurrent generated in the active layer.

According to an embodiment of the disclosure, the TFT photodetector may be formed in a structure in which when light is incident, electrons migrate into an N-type gate by tunneling from a P-type active layer to an oxide film, among charges of two PN areas excited with the oxide film in between, the electron migration changes a threshold voltage of a current channel between a source and a drain in correspondence with a change in a total amount of charge in the gate, photocurrent proportional to the intensity of the incident light flows in the active layer, and a voltage output is generated from the flowing photocurrent.

According to an embodiment of the disclosure, the active layer may include a material having a conductive property controllable by tunneling or an electric field.

According to an embodiment of the disclosure, the active layer may include at least one of amorphous silicon or polycrystalline silicon.

According to an embodiment of the disclosure, the TFT photodetector may include an amorphous transparent substrate including the transparent material, a source formed of amorphous silicon or polycrystalline silicon on the transparent substrate, a drain formed of amorphous silicon or polycrystalline silicon, opposite to the source on the transparent substrate, the active layer formed between the source and the drain and including a current channel formed between the source and the drain, an insulating oxide film formed on the source, the drain, and the active layer, and a light receiver formed on the insulating oxide film, configured to absorb light, and insulated from the active layer by the insulating oxide film.

According to an embodiment of the disclosure, in the TFT photodetector, when light is incident on the light receiver, electrons may migrate by tunneling through the insulating oxide film between the light receiver and the active layer excited with the insulating oxide film in between, the electron migration may change an amount of charge in the light receiver, the changed amount of charge may change a threshold voltage of the current channel, and thus photocurrent may flow in the current channel.

According to an embodiment of the disclosure, the TFT photodetector may use light generated from a display panel as a light source for the unit pattern.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

The disclosure will be described in detail with reference to the attached drawings. Lest it should obscure the subject matter of the disclosure, a known technology will not be described in detail. An ordinal number (e.g., first, second, and so on) used in the description of the disclosure is used simply to distinguish one component from another component.

When it is said that one component is "coupled to or with" or "connected to" another component, it is to be understood that the one component may be coupled to or connected to the other component directly or with a third party in between.

Figure 1:
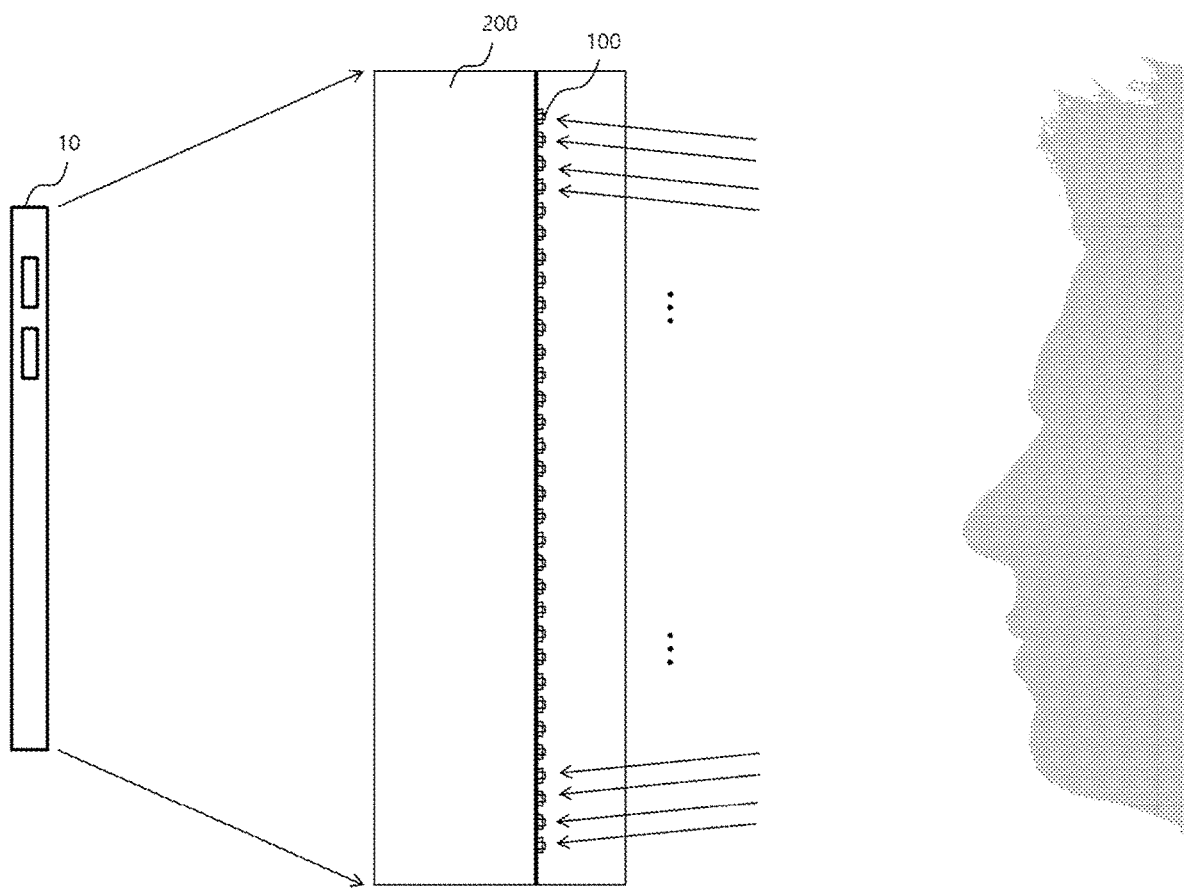
FIG. 1 is a schematic diagram illustrating a display module used as a touch panel in an electronic device with thin film transistor (TFT) photodetectors implemented on the touch panel according to an embodiment of the disclosure.

FIG. 1 is a schematic diagram illustrating a display module used as a touch panel in an electronic device with thin film transistor (TFT) photodetectors implemented on the touch panel according to an embodiment of the disclosure.

A TFT photodetector 100 according to the disclosure is formed on a touch screen panel 200 in an electronic device 10. The electronic device 10 may be any device equipped with a display, such as a smartphone, a laptop computer, a monitor, or a TV.

Specifically, TFT photodetectors 100 may be formed across the whole or part of the touch screen panel 200, and a TFT photodetector 100 may be formed in each individual pixel, thus operating as a part of the pixel. When TFT photodetectors 100 are formed across the whole touch screen panel 200, the number of the TFT photodetectors 100 may be equal to the number of pixels corresponding to the resolution of the touch screen panel 200. The touch screen panel 200 may be any of a light receiving display requiring a backlight unit (BLU), such as a liquid crystal display (LCD) or a light emitting display which emits light on its own, such as a light emitting diode (LED) (e.g., organic LED (OLED) or active matrix OLED (AMOLED)) display or a plasma display panel (PDP).

The touch screen panel 200 displays a video or an image or operates as a touch panel, according to an operation of the electronic device 10. When the touch screen panel 200 operates as a touch panel, an optical image of an external object may be acquired by means of a plurality of TFT photodetectors 100 implemented on the touch screen panel 200. A light source required for touch sensing may be an external light source such as natural light or an external lighting, or an internal light source such as a BLU or OLED elements of the touch screen panel 200.

As such, formation of TFT photodetectors 100 according to the disclosure on the touch screen panel 200 advantageously enables use of the touch screen panel 200 as a touch panel without the need for providing a separate touch panel in the electronic device 10. Further, because the touch screen panel 200 is used as a touch panel, a light source for display may also be used as a light source for touch sensing without the need for adding a light source for touch sensing in the electronic device 10. Therefore, the effects of device simplification and reduced fabrication cost may be expected.

Further, because a pixel of a unit pattern is formed in the same size as each pixel of the display, as many unit patterns as the number of pixels corresponding to the resolution of the display may be arranged in the electronic device 10. In this case, the whole display may serve as a touch panel. The electronic device 10 may acquire an image of an external object by controlling the touch panel in the whole or part of the display. Hereinbelow, the term "touch panel" is interchangeably used with "unit patterns of the touch panel". Obviously, a TFT photodetector 100 of the disclosure is formed in a unit pattern of the touch panel. A unit pattern will be described in detail with reference to FIG. 9.

Further, the electronic device 10 may acquire biometric information about an external object, such as information about a fingerprint, the vein of a finger, a face, or an iris, by the touch screen panel 200 with the TFT photodetectors 100 implemented thereon. For example, a user may enable acquisition of a fingerprint image through a plurality of image sensor pixels formed on an area of the display by touching the area with a finger or placing a finger within a predetermined distance to the area in the electronic device 10. Throughout the specification, the touch screen panel 200 may also be referred to as a display panel or a display in the same sense.

Now, a description will be given of implementation of TFT photodetectors on a touch panel.

Figure 2:
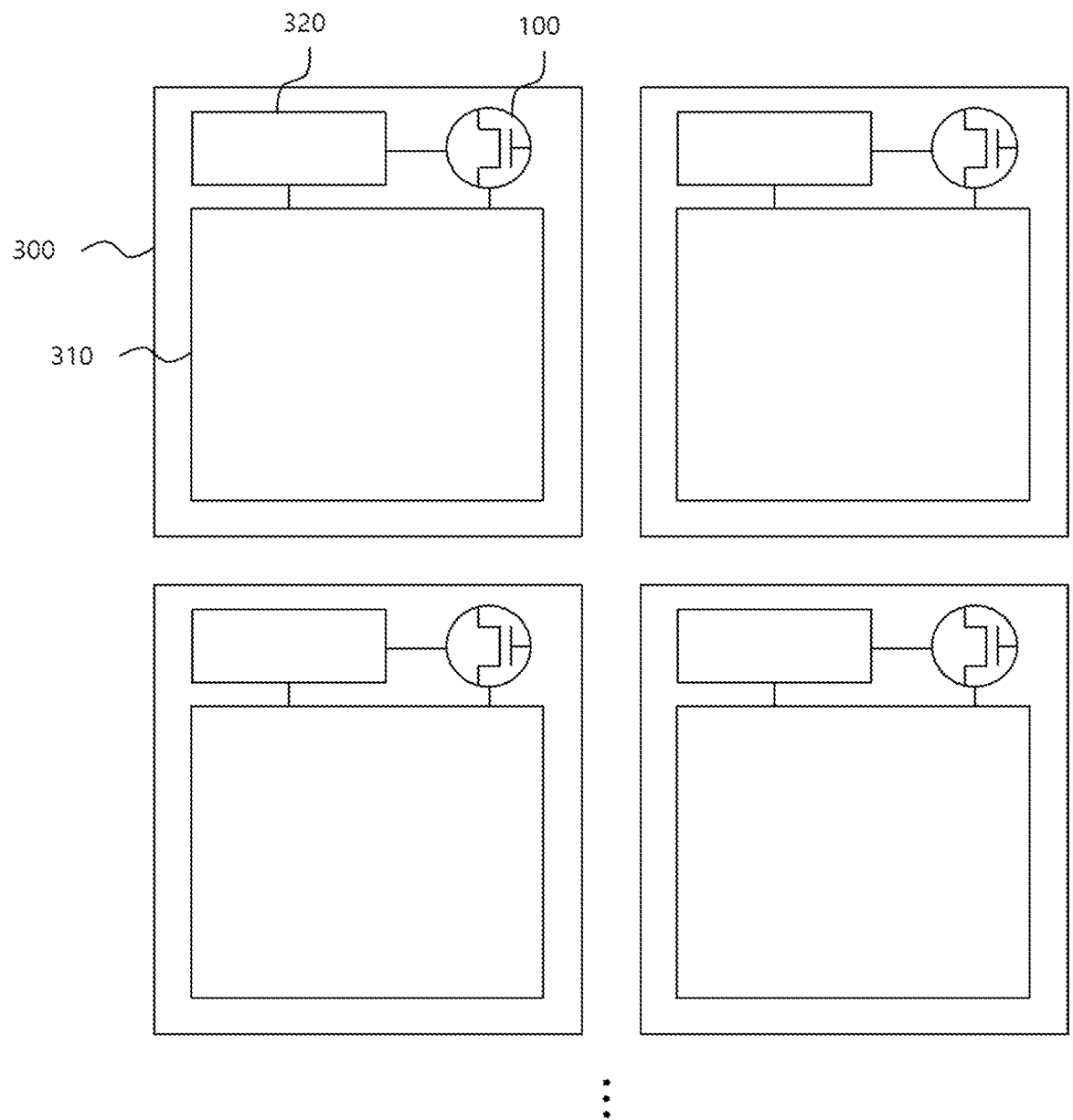
FIG. 2 is a diagram illustrating an exemplary TFT photodetector implemented on a pixel basis on a display according to an embodiment of the disclosure.

FIG. 2 is a diagram illustrating exemplary implementation of a TFT photodetector in each pixel of a display according to an embodiment of the disclosure.

Although the TFT photodetector 100 operates in a similar principle to that of a photo assisted tunneling-photodetector (PAT-PD) disclosed in U.S. patent application Ser. No. 15/885,757, the TFT photodetector 100 and the PAT-PD are different in that the PAT-PD is formed on a single crystalline silicon substrate, and an active layer, a source, a drain, and a gate serving as a light receiver are formed of single crystalline silicon, whereas the TFT photodetector 100 of the disclosure is formed on the touch screen panel 200 which is a glass substrate or a transparent flexible substrate using a transparent film formed of, for example, polyimide (PI), polyethylene terephthalate (PET), polypropylene (PP), polycarbonate (PC), polymethylmethacrylate (PMMA), polyethylenenaphthalate (PEN), polyetheretherketone (PEEK), polyethersulfone (PES), or polyarylite, and an active layer, a source, a drain, and a light receiver are formed of amorphous silicon (a-Si) or polycrystalline silicon (poly-Si or P-Si). Glass or a PI film is amorphous, which makes it impossible to stack single crystalline silicon thereon. Therefore, when TFT photodetectors are formed on a glass substrate or a flexible substrate, the TFT photodetectors should be amorphous or polycrystalline. Under circumstances, the amorphous silicon or the polycrystalline silicon may be replaced with a material with a conductive property controllable by an electric field or tunneling. Throughout the specification, the term "PAT-PD" or "TFT PAT-PD" is interchangeably used with "TFT photodetector".

Preferably, display pixels and touch panels are matched to each other in a one-to-one correspondence. FIG. 2 illustrates an exemplary pixel structure on the touch screen panel 200 with TFT photodetectors 100 implemented thereon. A unit pattern 300 of the touch screen panel 200 includes a light emitting area 310 for display, a driving switch 320, and a TFT photodetector 100 for touch sensing. The touch screen panel 200 may be designed such that the area of a unit pattern on a touch panel and the area of each pixel of the touch panel are of similar sizes and thus the display pixels and the touch panels are matched in a one-to-one correspondence per position. In this case, as the TFT photodetector 100 may operate using the light emitting area 310 of the display pixel as a light source, a signal may be processed by matching the light emitting area 310 to the TFT photodetector 100, and data may be processed by matching data included in the light source to data collected by the TFT photodetector 100.

Although it is preferable to form the TFT photodetector 100 without any overlap with the light emitting area 310, the TFT photodetector 100 may be formed overlapping with the light emitting area 310 over a predetermined area because the TFT photodetector 100 occupies a small area relative to the light emitting area 310. However, to maximize a photoelectric conversion effect, the introduction of unnecessary light is blocked by shielding an area except for the light receiver of the TFT photodetector 100 with a metal or the like. The resulting shielding of a part of the light emitting area 310 with the light shielding area except for the light receiver of the TFT photodetector 100 may decrease the light emission efficiency of the display.

In some cases, the display pixels and the touch panels may be configured in different sizes. For example, when the unit pixels of the image sensor are designed such that one display pixel area corresponds to n touch panels, n TFT photodetectors 100 share the light emitting area of one display pixel as a light source, making it difficult to control the TFT photodetectors 100 individually by light source control. However, the light source control may be simplified, which in turn simplifies a touch sensing process. On the contrary, the touch panels may be designed such that the area of a touch panel corresponds to the area of m display pixels. In this case, although fewer touch panels than the number of pixels corresponding to the resolution of the display may be arranged, one TFT photodetector 100 uses the light emitting areas of m display pixels as a light source, and thus fine light source control and data processing required for touch sensing may become difficult.

The light emitting area 310 may be formed in a different structure according to the type of a used display. For example, when the touch screen panel 200 of the electronic device 10 is a light emitting display such as an OLED display, the light emitting area 310 may be a light emitting pixel with red, green, blue (RGB) sub-pixels arranged therein. When the touch screen panel 200 of the electronic device 10 is a light receiving display such as an LCD, RGB sub-filters may be arranged in the light emitting area 310. Obviously, the TFT photodetector 100 may use an external light source such as natural light as a light source for touch sensing, instead of the light emitting area 310.

With reference made to FIG. 2 again, a plurality of unit patterns 300 are arranged in a lattice structure on the touch screen panel 200. Each unit pattern 300 may be formed by vertically stacking or arranging side by side a display sub-panel formed on a glass substrate or a transparent flexible substrate and a touch sub-panel formed on a glass substrate or a transparent flexible substrate. In this regard, FIGS. 3A and 3B illustrate the cross sections of unit patterns 300 on the display.

Figure 3A:
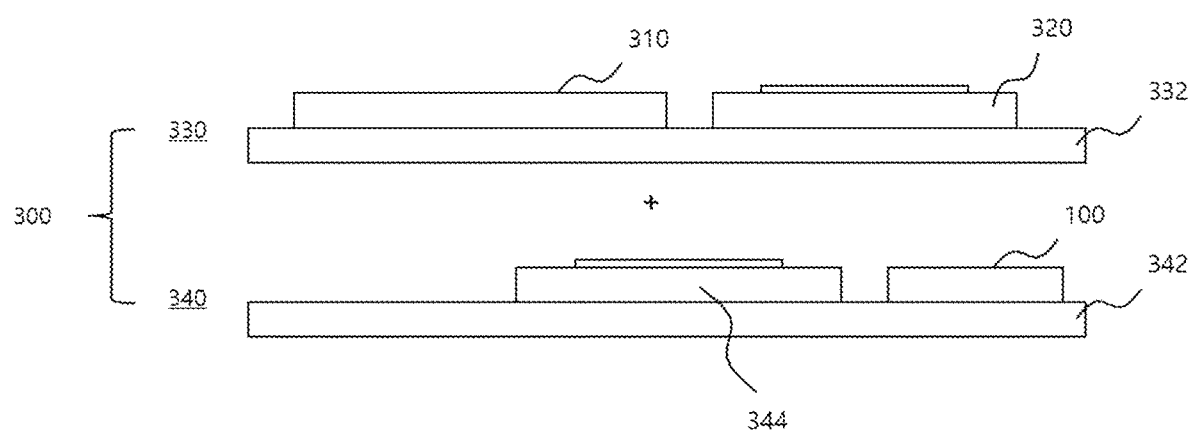
FIGS. 3A and 3B are sectional views illustrating exemplary implementations of a TFT photodetector on a pixel basis on a display according to an embodiment of the disclosure.
Figure 3B:
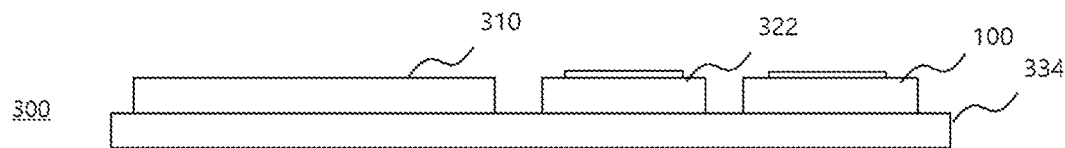

Referring to FIGS. 3A and 3B, the unit pattern 300 of a touch panel includes a display sub-panel 330 and a touch sub-panel 340. The display sub-panel 330 may include a light emitting area 310 for display and its driving switch 320, and the touch sub-panel 340 may include a TFT photodetector 100 for touch sensing and a detector driving TFT 344 for driving the TFT photodetector 100.

For example, the detector driving TFT 344 may include at least one transistor which is electrically coupled to a source side of the TFT photodetector 100 and generates a voltage output from photocurrent generated in the active layer of the TFT photodetector 100.

The display sub-panel 330 or the touch sub-panel 340 is formed on a transparent glass substrate or a transparent flexible substrate such as a PI film (hereinafter, also referred to as a glass substrate or a transparent substrate). The transparent touch screen panel 200 may be formed by vertically stacking and attaching the two panels as illustrated in FIG. 3A or arranging the two panels side by side on the same glass substrate 334 as illustrated in FIG. 3B.

Particularly, the touch sub-panel 340 may be stacked with the display sub-panel 330 in the structure of FIG. 3A. Further, in reaction to light sensed by the touch sub-panel 340, a voltage output may be generated from photocurrent generated from the active layer.

When light is incident on the touch sub-panel 340, electrons are introduced into an N-type gate by tunneling from a P-type active layer to an oxide film, among charges of two PN areas excited with the oxide film in between. The electron migration changes the threshold voltage of a current channel between a source and a drain in correspondence with a change in the total amount of charge in the gate, and thus photocurrent proportional to the intensity of the incident light flows in the active layer. Further, the touch sub-panel 340 may generate a voltage output from the flowing photocurrent.

Alternatively, the light emitting area 310 and the driving switch 320 of an OLED device for display, and the TFT photodetector 100 for touch sensing and the detector driving TFT 344 may be arranged together on the same glass substrate 332 or 342, as illustrated in FIG. 3B. In this case, a driving switch 322 may be formed by incorporating a switching TFT for controlling the light emitting area 310 with a switching TFT for controlling the TFT photodetector 100, or driving switches may be formed separately.

Throughout the specification, the display sub-panel 330 and the touch sub-panel 340 may also be referred to as a display pixel and a touch panel, respectively.

As described before, the image sensor pixel 340 of a similar size to that of the display pixel 330 senses light and acquires an image by signal processing and detector driving, and includes the TFT photodetector 100 and the detector driving TFT 344 for driving the TFT photodetector 100. The driving switch 320 for an output to be used for display, and the detector driving TFT 344 for driving the TFT photodetector 100 formed on a touch panel basis may be integrated or configured separately. In this manner, the TFT photodetector 100 of the disclosure is formed on a pixel basis.

Because the TFT photodetector 100 should be formed on an amorphous substrate such as a glass substrate or a PI film, not a single crystalline silicon substrate, the TFT photodetector 100 should be implemented in a different manner from an existing photodetector using single crystalline silicon.

Now, a description will be given of a detailed structure, operation mechanism, fabrication method of a TFT photodetector according to the disclosure.

Figure 4:
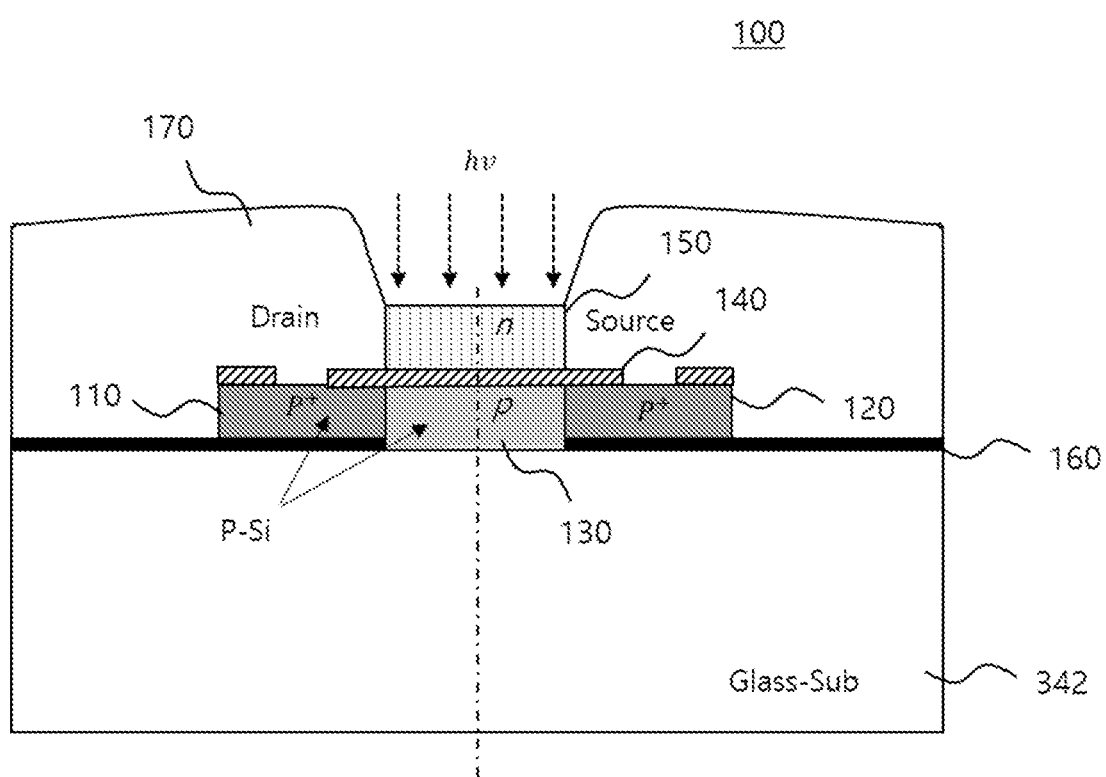
FIG. 4 is a sectional view illustrating a TFT photodetector according to an embodiment of the disclosure.

FIG. 4 is a sectional view illustrating a TFT photodetector according to an embodiment of the disclosure.

Referring to FIG. 4, the TFT photodetector 100 of the disclosure is formed on the transparent substrate 342 such as an amorphous glass substrate or a flexible substrate, and includes, on the transparent substrate 342, a gate 150 formed of a-Si or poly-Si, an insulating oxide film 140 capable of controlling tunneling of optically excited charges, a drain 110, a source 120, and an active layer 130 in which a current channel is formed between the source 120 and the drain 110. While the drain 110, the source 120, the active layer 130, and the gate 150 are formed of a-Si or poly-Si, they may be formed of any other material as far as the material has a conductive property controllable by tunneling or an electric field.

The gate 150 is formed of N-type poly-Si or a-Si by implanting an N-type impurity and operates as a light receiver that absorbs incident light. The active layer 130 is formed of P-type poly-Si or a-Si, with the insulating oxide film 140 between the active layer 130 and the gate 150. The active layer 130 forms a current channel according to optical excitation between the drain 110 and the source 120 which are P+-type diffusion layers.

An area on which light is incident is confined to the gate 150 serving as the light receiver and the active layer 130 with the insulating oxide film 140 interposed between the active layer 130 and the gate 150. For this purpose, a metal protection layer 160 may be formed on a boundary surface of the transparent substrate 342, except for the area between the transparent substrate 342 and the active layer 130, to shield unnecessary light introduced into the TFT photodetector 100. A metal shielding layer 170 may be formed in the remaining area except for the gate 150 in an upper part of the TFT photodetector 100. The shielding layer 170 may be formed by a silicide and metal process. The TFT photodetector 100 limits an area on which light is incident to the gate 150 serving as the light receiver by means of the shielding layer 170, thereby maximizing the photoelectric conversion in the gate 150. Hereinbelow, the gate 150 and the light receiver are interchangeably used throughout the specification.

With no light introduced, the TFT photodetector 100 controls biases of the gate 150, the drain 110, the source 120, and the active layer 130 to maintain a stable equilibrium state in which electrons are trapped. For this purpose, the overlying shielding layer 170 and the metal protection layer 160 on the boundary surface of the transparent substrate 342 are provided to shield unintended unnecessary light through the transparent substrate 342 of, for example, glass. Specifically, the active layer 130 between the source 120 and the drain 110 is bias-controlled to have a threshold voltage at which the potential state of a silicon surface on which a current channel may be formed is shortly before a subthreshold state during an initial fabrication process. In this state, when light is not incident on the gate 150 as the light receiver, photocurrent does not flow in the current channel.

When light is incident on the light receiver, electrons are introduced into the N-type gate 150 by tunneling from the P-type active layer 130 to the insulating oxide film 140, among charges of the two PN areas excited with the insulating oxide layer 140 in between, the electron migration changes the threshold voltage of the current channel between the source 120 and the drain 110 in correspondence with a change in the total amount of charge in the gate 150, the threshold voltage modulation effect caused by the change in the amount of charge in the light receiver causes a change in the conductance of the current channel, and thus photocurrent corresponding to the changed conductance flows.

Since the gate 150 is doped with holes, the electrons passed through the insulating oxide film 140 by tunneling are combined with holes in an area of the gate 150 near to the insulating oxide film 140, thereby generating a depletion layer at the top end of the insulating oxide film 140. Therefore, the threshold voltage drops due to a change in the charge of the active layer 130 near to the insulating oxide film 140, thereby exciting the current channel between the source 120 and the drain 110.

In other words, current that flows in the current channel excited between the source 120 and the drain 110 by light reception at the light receiver is not a direct flow of charges of electron-hole pairs (EHPs) caused by the light reception but an indirect current flow in the current channel excited by tunneling of directly generated charges. Therefore, a very high-efficiency light detection capability may be achieved.

FIGS. 5A-5D are sectional views illustrating a process of fabricating a TFT photodetector according to an embodiment of the disclosure.

Figure 5A:
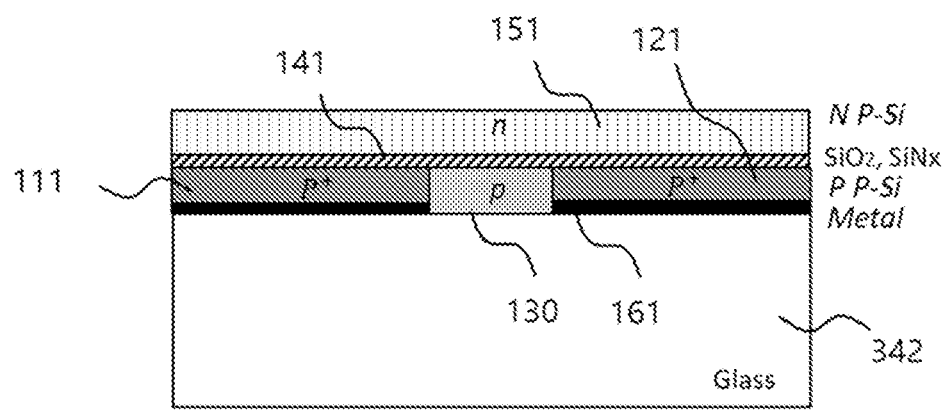
FIGS. 5A-5D are sectional views illustrating a process of fabricating a TFT photodetector according to an embodiment of the disclosure.

In FIG. 5A, the P-type poly-Si or a-Si diffusion layer 130 to be used as an active layer is formed on the glass substrate 342 or a flexible substrate of, for example, a PI film, and two P+-type diffusion layers 111 and 121 are formed of a-Si or poly-Si at both sides of the diffusion layer 130.

The diffusion layers 130, 111, and 121 may be formed of a-Si or poly-Si. To increase mobility, the diffusion layers 130, 111, and 121 may be formed by depositing a-Si and then crystallizing the deposited a-Si into poly crystals by thermal treatment such as laser annealing, or directly depositing poly-Si on the transparent substrate.

Subsequently, a thin $SiO_2$ or $SiN_x$ insulating oxide film 141 is formed on the diffusion layers 130, 111, and 121. The insulating oxide film 141 may be formed by sputtering or plasma enhanced chemical vapor deposition (PECVD).

Subsequently, an N-type diffusion layer 151 is formed of poly-SI or a-Si on the insulating oxide film 141 in the same manner.

Figure 5B:
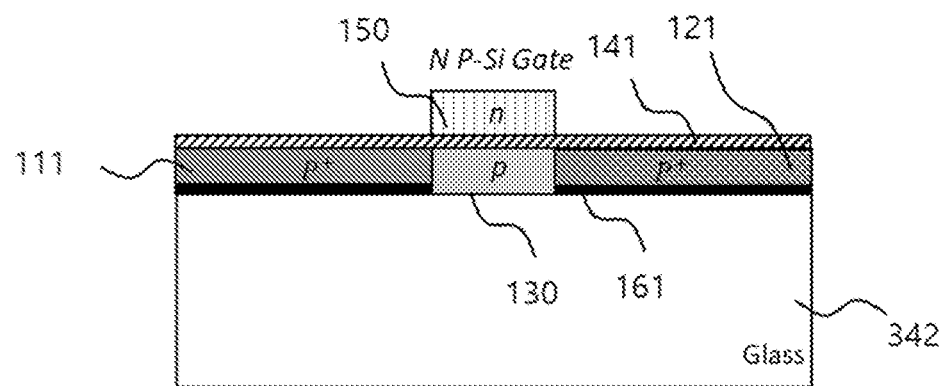
Figure 5C:
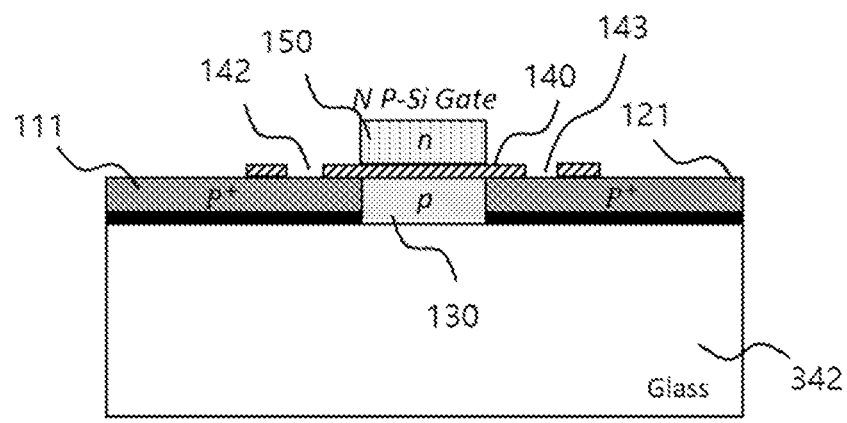

Referring to FIG. 5B, the gate 150 is then formed for use as a light receiver by photo-patterning the generated diffusion layer 151. Referring to FIG. 5C, the generated insulating oxide layer 141 is etched away, remaining only a necessary part by a photoresist (PR) patterning process. Partial insulating oxide films 142 and 143 are removed together on areas of the diffusion layer 121, which are to be used as the source 120 and the drain 110, so that a source electrode and a drain electrode may be connected.

Figure 5D:
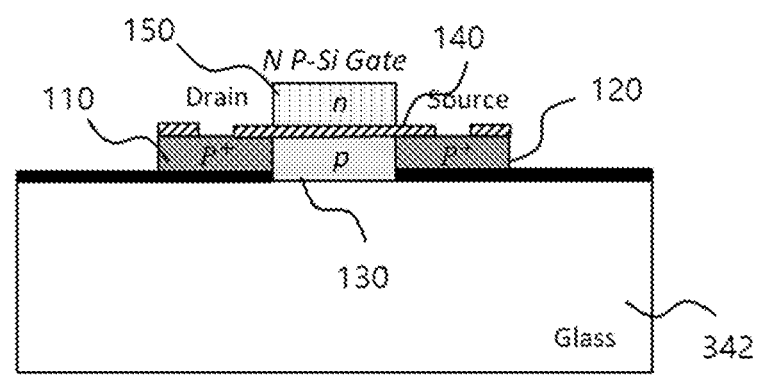

Referring to FIG. 5D, the remaining area except for the areas to be used as the source 120 and the drain 110 is then removed from the P+-type diffusion layers 111 and 121 by etching. Electrodes are formed by depositing a metal or the like in the areas of the insulating oxide films 142 and 143 which have been removed in the source 120 and the drain 110.

In the TFT photodetector 100 fabricated in the above manner, current flows through a current channel excited between the source 120 and the drain 110 by tunneling, as described before. If the thickness of the active layer 130 is equal to or larger than a predetermined thickness, for example, 100 nm, a neutral area is produced separately in an area under the gate 150, which has not been depleted perfectly, aside from the current channel generated by light. Unnecessary extra charges generated by light may be accumulated in the neutral area, and are likely to act as a changing factor to the threshold voltage which linearly changes by light. Therefore, the neutral area needs separate processing.

Figure 6:
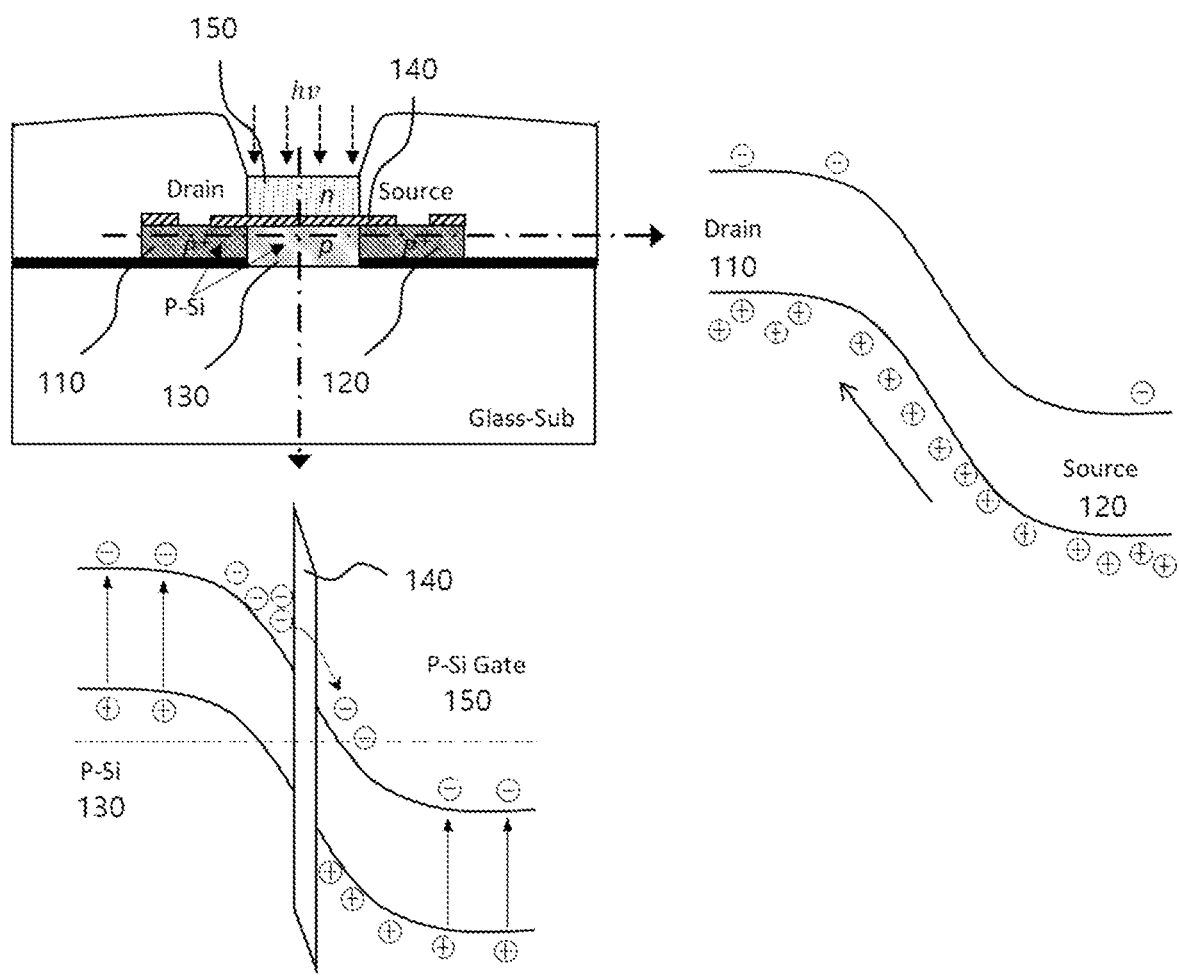
FIG. 6 is an energy band diagram illustrating a photoelectric conversion mechanism of a TFT photodetector according to an embodiment of the disclosure.

FIG. 6 is an energy band diagram referred to for describing a photoelectric conversion mechanism of a TFT photodetector according to an embodiment of the disclosure.

When light is incident on the gate 150 as the light receiver, EHPs are generated in the gate 150 and the active layer 130. Excited electrons of the active layer 130 tunnels through the insulating oxide film 140 by an electric field, thereby depleting a bottom end portion of the gate 150. As a result, the total charge amount of the gate 150 is changed, which leads to a threshold voltage modulation effect equivalent to application of a negative power source to the gate 150. Accordingly, a current channel is formed in the active layer 130 of poly-Si, and thus current flows between the source 120 and the drain 110. The TFT photodetector 100 implemented based on this structure and principle has a high-sensitivity detection capability of sensing even a single photon and enables very intense photocurrent to flow even with a small amount of light.

Figure 7:
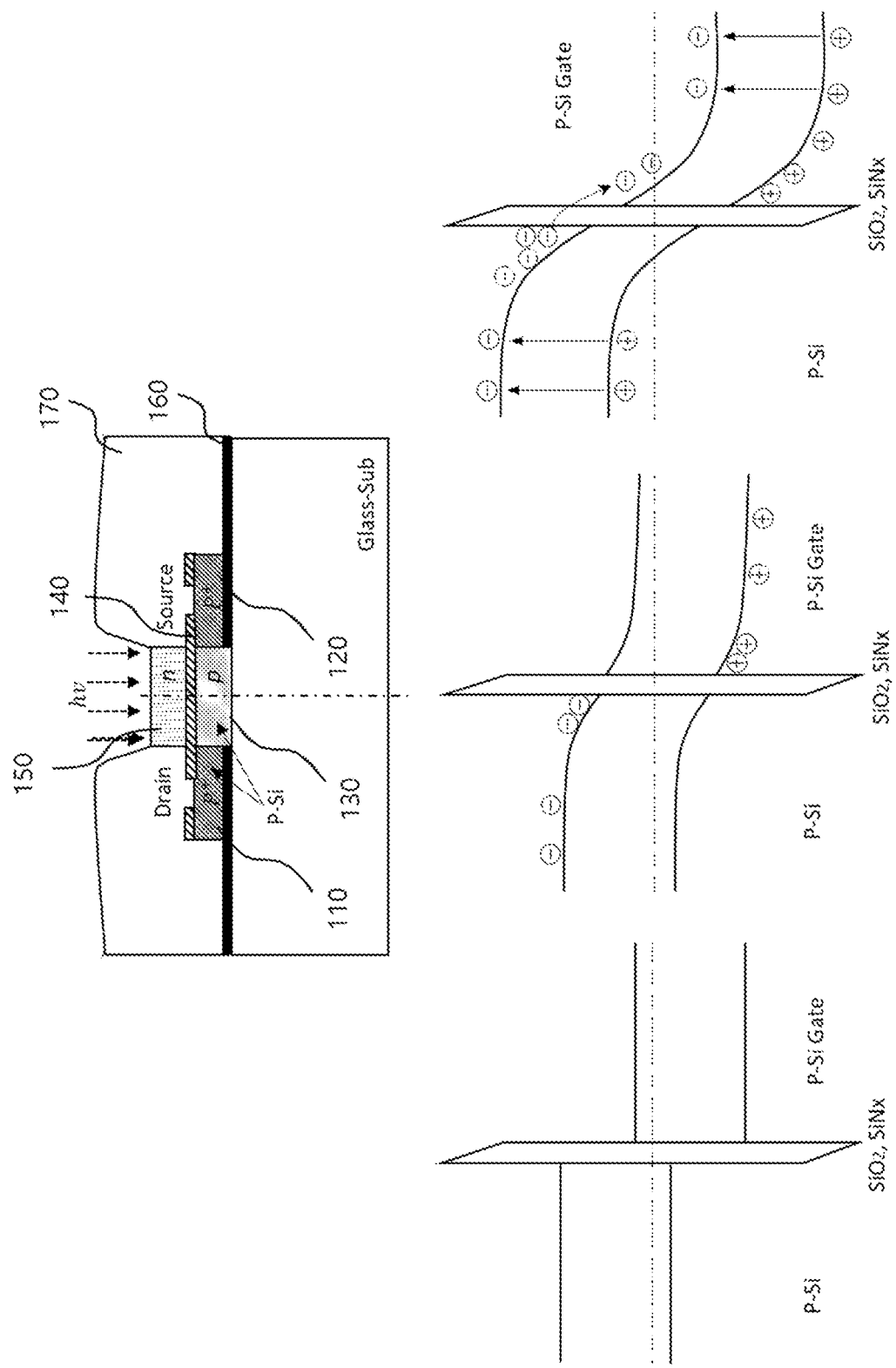
FIG. 7 is an energy band diagram illustrating a tunneling mechanism of a TFT photodetector according to an embodiment of the disclosure.

FIG. 7 is an energy band diagram referred to for describing a tunneling mechanism of a TFT photodetector according to an embodiment of the disclosure.

In the TFT photodetector 100, the shielding layer 170 is formed such that only the gate 150 serving as the light receiver and the active layer 130 facing the gate 150 with the insulating oxide film 140 in between are affected by light, with no effect of light on the remaining area. The shielding layer 170 may be formed by a silicide and metal process, and may not be formed on the gate 150 through a mask.

Light of multiple wavelengths incident on the TFT photodetector 100 is mostly transmitted through or absorbed to the gate 150 formed of poly-Si or a-Si.

If the thickness of the gate 150 is equal to or larger than a predetermined value, for example, 300 nm, short-wavelength light of the blue family in light incident on the TFT photodetector 100 is mostly absorbed to the gate 150, while only very partial short-wavelength light reaches the active layer 130 under the gate 150.

As described above, since the TFT photodetector 100 has an excellent high-sensitivity detection capability compared to a conventional photodetector, even though only a very small part of light of a short wavelength incident on the gate 150 is transmitted through the gate 150 and reaches the active layer 130, the threshold voltage of the current channel is accordingly changed and thus even a slight change in light may be sensed.

Light of the other wavelengths is also transmitted through the gate 150 and reaches the active layer 130 in the same principle. Accordingly, the same phenomenon as observed from reception of light of a short wavelength occurs to the gate 150, thereby causing a change in the threshold voltage of the current channel. However, because light of a relatively long wavelength is easily transmitted through the gate 150 and reaches the active layer 130, compared to light of a short wavelength, the light of a long wavelength generates more EHPs in the active layer 130. Therefore, more electrons migrate to the gate 150 through the insulating oxide film 140 by tunneling, causing a change in the threshold voltage of the current channel between the source 120 and the drain 110.

The metal protection layer 160 formed between the transparent substrate 342 and the active layer 130 blocks light introduced through the transparent substrate 342 from reaching an area other than the active layer 130. Therefore, the light is absorbed only to or transmitted only through the active layer 130 adjacent to the gate 150, leading to efficient tunneling through the insulating oxide film 140.

For more efficient tunneling, a predetermined voltage may be applied between the gate 150 of poly-Si and the active layer 130 of poly-Si, or a property such as dark current may be adjusted by adjusting a tunneling probability and controlling an initial threshold voltage of the TFT photodetector 100.

Then, when the intensity of light is decreased or light is blocked, tunneled electrons are re-tunneled to the active layer 130, and thus the amount of charge in the gate 150 returns to an original level. Accordingly, the formed depletion layer is reduced and, at the same time, photocurrent generated in the current channel is also reduced.

However, it may occur that charges have not completely disappeared and thus have remained in the active layer 130 even after the light blocking, causing an error such as a signal delay in the next light irradiation. To avert this problem, the thickness of the active layer 130 may be controlled such that an area remaining as a neutral area, in which no channel is generated, may be reduced, or a reset device may be added to remove the charges remaining in the active layer 130.

Figure 8:
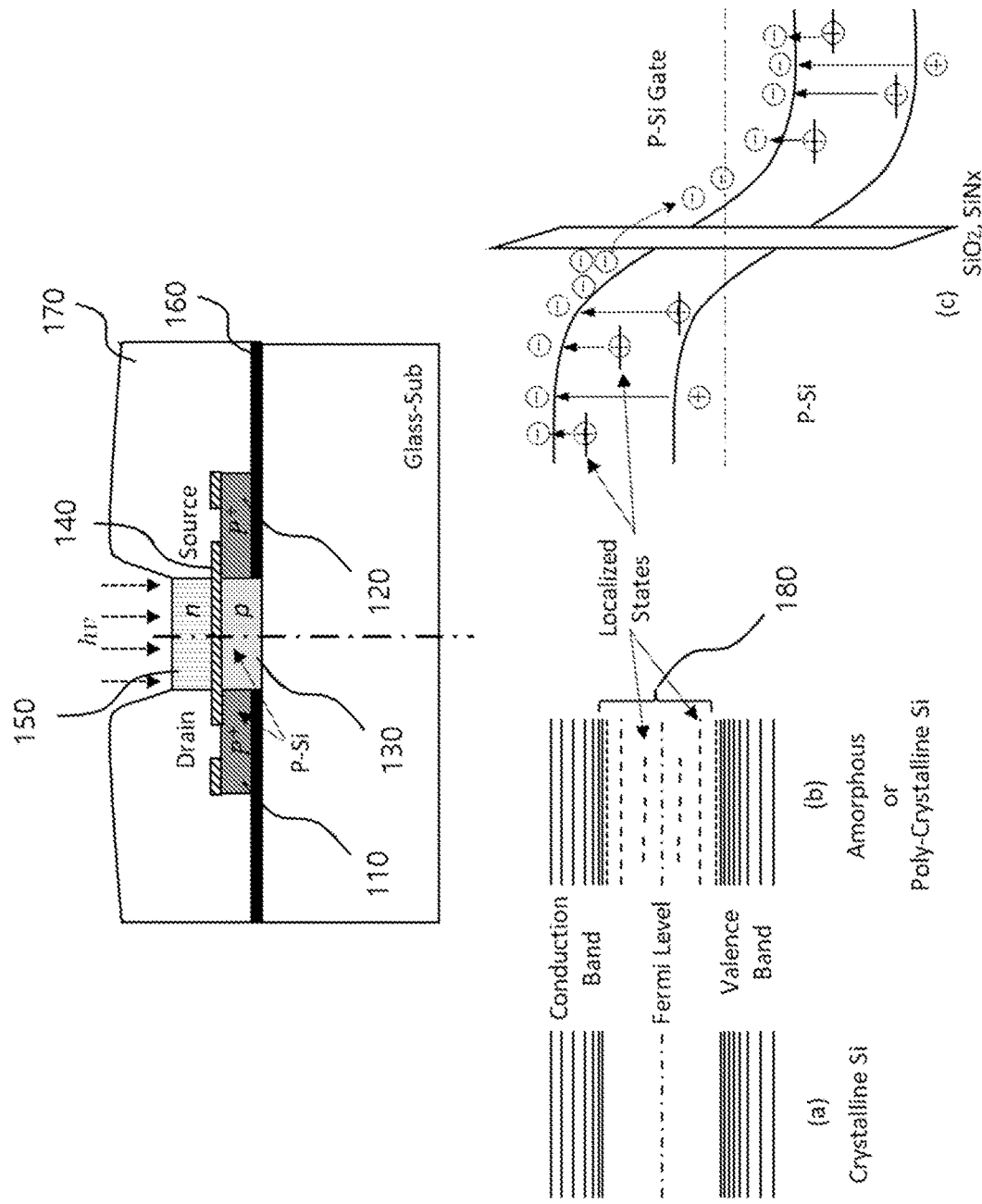
FIG. 8 is a diagram illustrating a photo-electric conversion mechanism caused by a plurality of localized states in a TFT photodetector formed of amorphous silicon (a-Si) or polycrystalline silicon (poly-Si or P-Si)

FIG. 8 illustrates a mechanism for photoelectric conversion caused by a plurality of localized states in a TFT photodetector formed of a-Si or poly-Si.

Panel (a) of FIG. 8 illustrates the energy band of general single crystalline silicon, and panel (b) of FIG. 8 illustrates the energy bands of the gate and the active layer of a TFT photodetector of a-Si or poly-Si.

In the TFT photodetector 100, electrons are introduced into the N-type gate 150 by tunneling from the P-type active layer 130 to the insulating oxide film 140, among charges of the two PN areas excited with the insulating oxide layer 140 in between, the electron migration changes the threshold voltage of the current channel between the source 120 and the drain 110 in correspondence with a change in the total amount of charge in the gate 150, the threshold voltage modulation effect caused by the change in the amount of charge in the light receiver causes a change in the conductance of the current channel, and thus photocurrent corresponding to the changed conductance flows.

As the gate 150 as the light receiver and the active layer 130 are formed of a-Si or poly-Si, instead of single crystalline silicon, according to an embodiment of the disclosure, a plurality of localized energy levels are formed in the gate 150 and the active layer 130, thereby forming a wavelength extension layer 180 that extends the wavelength range of light absorbed by the TFT photodetector 100.

The wavelength extension layer 180 is formed of a-Si or poly-Si. As illustrated in panel (b) of FIG. 8, a plurality of local energy levels are generated through multiple localized states formed in a forbidden band between the conduction band and valence band of the gate 150 and the active layer 130. The localized states are naturally generated in the forbidden band in view of the nature of the a-Si/poly-Si structure, which obviates the need for applying stress or implanting ion to artificially form the localized states. Therefore, processes are simplified.

Accordingly, the TFT photodetector 100 may generate EHPs by absorbing light even at an energy level lower than 1.12 eV which is the band gap energy of the general single crystalline silicon, thereby enabling detection of the wavelength range of the near-infrared area, which is longer than a maximum detectable wavelength of silicon, 1150 nm, and detection of light in a wavelength that a general silicon photodiode is not capable of detecting.

As described above, because the TFT photodetector 100 is formed of a-Si or poly-Si, compared to a conventional photodetector formed of single crystalline silicon, the wavelength extension layer 180 including multiple localized states in the forbidden band exists, and there is no need for artificially forming localized states by applying uniaxial tensile stress on single crystalline silicon, combining hetero elements (e.g., Ge or the like), implanting ions (e.g., P, B, N, Ga, or the like), or increasing the doping density of an oxide film, poly-Si, and/or a substrate to control a thermal process strength. Therefore, a fabrication process is simplified.

As described before, the TFT photodetector 100 according to the embodiment of the disclosure may generate a flow of photocurrent with an intensity higher than the conventional photodetector by hundreds of times to a few thousands of times, for the same light intensity.

Further, because the TFT photodetector 100 according to the embodiment of the disclosure includes a plurality of localized states, the wavelength range in which a valid signal is detectable is extended. Thus, the TFT photodetector 100 is applicable to a sensor for touch recognition, or the like.

While the TFT photodetector 100 has been described as implemented in a similar structure to a P-channel metal-oxide semiconductor (PMOS), this should not be construed as limiting. The TFT photodetector 100 may be implemented in a similar structure to an N-channel metal-oxide semiconductor (NMOS) by exchanging the doping impurities of the gate and the active layer.

With reference to FIGS. 9 to 14, a unit pattern including a TFT photodetector 100 will be described in greater detail.

When a PAT-PD pixel is formed on a substrate by the above-described TFT process, various types of pixel structures are available according to the thickness of an active layer.

The substrate may include a glass substrate or a flexible substrate such as a polyimide film.

The active layer may include a material with a conductive property controllable by tunneling or an electric field. For example, the active layer may include at least one of a-Si or poly-Si.

According to the disclosure, a transparent touch screen panel capable of displaying and touch sensing may be implemented by vertically stacking a display panel and a touch panel or arranging the display panel and the touch panel on the same panel.

Further, according to the disclosure, a switching TFT for display and a driving TFT for touch sensing may be fabricated in a single process by arranging a screen panel and a touch panel on the same panel.

Embodiments of the pixel structure of a unit pattern according to the thickness of an active layer will be described with reference to FIGS. 9 to 12.

The active layer may have a different pixel structure according to a reference value, for example, a thickness of 100 nm.

Figure 9:
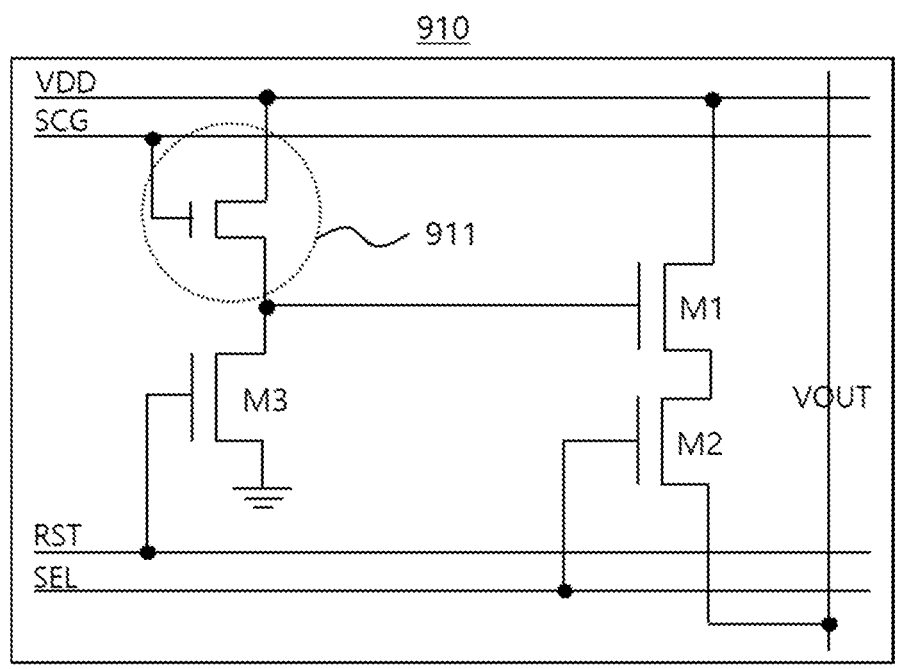
FIGS. 9 and 10 are diagrams illustrating unit patterns (or unit pixels) when an active layer is 100 nm or less thick.
Figure 10:
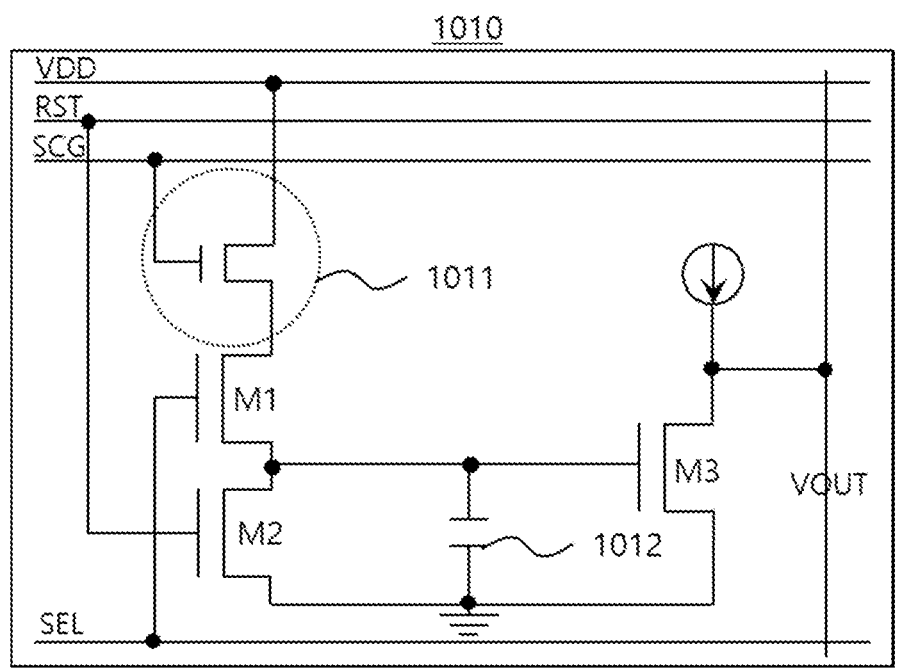

FIGS. 9 and 10 are diagrams illustrating unit patterns when an active layer is 100 nm or less thick.

A unit pattern 910 may include a TFT photodetector 911 having an active layer formed of a-Si or poly-Si and at least one transistor on an amorphous transparent substrate. In the embodiment of FIG. 9, the at least one transistor may include transistors M1, M2 and M3.

In the TFT photodetector 911, when light is incident, electrons may be introduced into an N-type gate by tunneling from a P-type active layer to an oxide film, among charges of two PN areas excited with the oxide layer in between. As the introduced electron migrate, a threshold voltage of a current channel between a source and a drain is changed in correspondence with a change in the total amount of charge in the gate. Further, photocurrent proportional to the intensity of the incident light flows in the TFT photodetector 911 according to the changed threshold voltage. The TFT photodetector 911 may generate a voltage output from the flowing photocurrent. The transistors M1, M2 and M3 may be electrically coupled to the TFT photodetector 911 and generate a voltage output from photocurrent generated in the active layer of the TFT photodetector 911.

In FIG. 9, the unit pattern 910 may convert photocurrent into a voltage output using parasitic capacitance generated in at least one transistor.

Specifically, the unit pattern 910 may be convert photocurrent into a voltage output using parasitic capacitance generated between the transistors M1 and M3.

The transistor M2, which is a selection transistor, may control charging of a parasitic capacitor.

Specifically, when the selection transistor M2 is turned on, photocurrent obtained by photo-electric conversion in the TFT photodetector 911 may be charged in the parasitic capacitor. Further, the photocurrent charged in the parasitic capacitor may be realized as an image.

In the turn-on state, the selection transistor M2 may reset signals when BUS_RST is turned on.

Specifically, when BUS_RST is turned on in the turn-on state of the transistor M2, charges may be removed from an entire column bus and the TFT photodetector 911 through a ground GND.

In this operation, an integration time substantially required for a touch sensor may be defined, and a continuous touch may be obtained in a shutter scheme.

FIG. 10 illustrates a unit pattern 1010 which directly charges a capacitor, instead of parasitic capacitance.

Specifically, the unit pattern 1010 may directly charge a capacitor 1012 coupled to a source follower with photocurrent generated from a TFT photodetector 1011 in response to a touch.

In the TFT photodetector 1011, when light is incident, electrons may be introduced into an N-type gate by tunneling from a P-type active layer to an oxide film, among charges of two PN areas excited with the oxide layer in between. As the introduced electron migrate, a threshold voltage of a current channel between a source and a drain is changed in correspondence with a change in the total amount of charge in the gate. Further, photocurrent proportional to the intensity of the incident light flows in the TFT photodetector 1011 according to the changed threshold voltage. The TFT photodetector 1011 may generate a voltage output from the flowing photocurrent. Transistors M1, M2 and M3 may be electrically coupled to the TFT photodetector 1011 and generate a voltage output from photocurrent generated in the active layer of the TFT photodetector 1011.

In the embodiment of FIG. 10, the use of the capacitor 1012 may lead to larger capacitance than parasitic capacitance. Further, the large capacitance may be controlled to obtain a larger dynamic-range output characteristic than in the embodiment of FIG. 9.

In the embodiment of FIG. 10, at least one transistor may include a selection transistor M1.

When the selection transistor M1 is turned on, the capacitor 1012 of an IVC circuit may be charged, among capacitors coupled to a transistor corresponding to a source follower.

Specifically, photocurrent obtained by photo-electric conversion in the TFT photodetector 1011 may be charged in the capacitor 1012 of the IVC circuit inside a pixel due to the turn-on of the selection transistor M1.

Further, the photocurrent charged in the capacitor 1012 may be converted into a voltage and output as IVC_OUT, which may be delivered in the form of a signal to a separate driving circuit such as co-double sampling (CDS).

The transmitted signal may be reset by the selection transistor M1.

For example, when BUS_RST (M2) is turned on in the turn-on state of the selection transistor M1, charges may be removed from the capacitor 1012, an entire column bus, and the TFT photodetector 1011 of the IVC circuit through a ground GND.

In this operation, an integration time substantially required for a touch sensor may be defined, and successive images may be obtained in a shutter scheme.

For example, because an active layer of poly-Si may be formed to a thickness smaller than 100 nm on glass in the TFT photodetector 1011 used in FIG. 10, a fully depleted current channel area may be achieved.

Further, since the fully depleted current channel area may be formed in the TFT photodetector 1011 in FIG. 10, a detector transistor for reset is not required separately.

Figure 11:
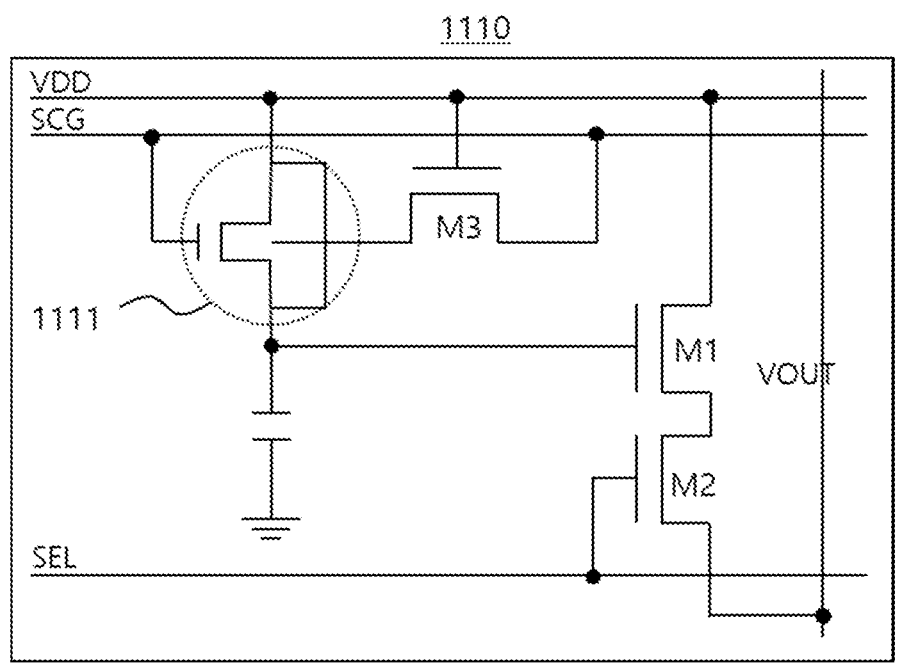
FIGS. 11 and 12 are diagrams illustrating unit patterns (or unit pixels) when an active layer is 100 nm or more thick.
Figure 12:
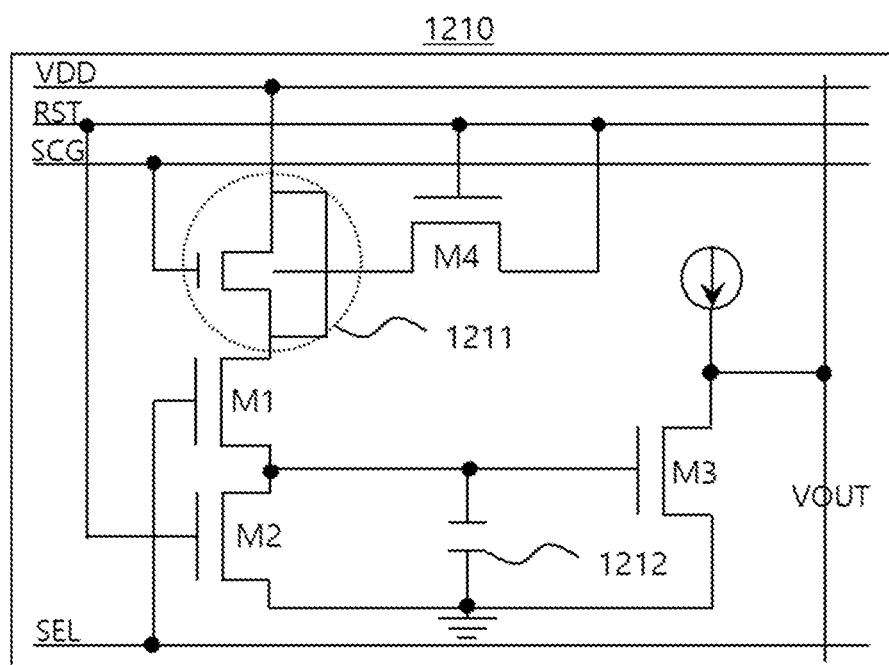

FIGS. 11 and 12 are diagrams illustrating unit patterns when an active layer is 100 nm or more thick.

When a poly-Si active layer is formed to a thickness of 100 nm or more on glass in a fabrication process, a neutral area is formed under a gate which has not been fully depleted in addition to a current channel generated by light.

Unnecessary extra charges generated by light may be accumulated in this neutral area. Moreover, the accumulated charges may act as a separate factor that changes a threshold voltage which linearly changes by light.

The residual charges may be controlled by directly coupling an additional transistor to the active layer.

Referring to FIG. 11, for this purpose, a unit pattern 1110 includes a TFT photodetector 1111 having a poly-Si active layer formed to a thickness of 100 nm or more.

In the TFT photodetector 1111, when light is incident in response to a touch, electrons may be introduced into an N-type gate by tunneling from a P-type active layer to an oxide film, among charges of two PN areas excited with the oxide layer in between. As the introduced electron migrate, a threshold voltage of a current channel between a source and a drain is changed in correspondence with a change in the total amount of charge in the gate. Further, photocurrent proportional to the intensity of the incident light flows in the TFT photodetector 1111 according to the changed threshold voltage. The TFT photodetector 1111 may generate a voltage output from the flowing photocurrent. Transistors M1 and M2 may be electrically coupled to the TFT photodetector 1111 and generate a voltage output from photocurrent generated in the active layer of the TFT photodetector 1111.

A transistor M3 is directly coupled to the active layer of the TFT photodetector 1111.

The transistor M3 may be configured to have a gate connected to VDD, a drain connected to the active layer of the TFT photodetector 1111, and a source connected to SCG. That is, as VDD is input to the gate, unnecessary extra residual charges accumulated in the poly-Si active layer of the TFT photodetector 1111 may flow from the drain to the source to be controlled through an SCG channel.

Referring to FIG. 12, a unit pattern 1210 includes a TFT photodetector 1211 having a poly-Si active layer formed to a thickness of 100 nm or more.

In the TFT photodetector 1211, when light is incident in response to a touch, electrons may be introduced into an N-type gate by tunneling from a P-type active layer to an oxide film, among charges of two PN areas excited with the oxide layer in between. As the introduced electron migrate, a threshold voltage of a current channel between a source and a drain is changed in correspondence with a change in the total amount of charge in the gate. Further, photocurrent proportional to the intensity of the incident light flows in the TFT photodetector 1211 according to the changed threshold voltage. The TFT photodetector 1211 may generate a voltage output from the flowing photocurrent. Transistors M1, M2 and M3 may be electrically coupled to the TFT photodetector 1211 and generate a voltage output from photocurrent generated in the active layer of the TFT photodetector 1211.

A transistor M4 is directly coupled to the active layer of the TFT photodetector 1211.

The transistor M4 may be configured to have a gate connected to RST, a drain connected to the active layer of the TFT photodetector 1211, and a source connected to RST. That is, as RST is input to the gate, unnecessary extra residual charges accumulated in the poly-Si active layer of the TFT photodetector 1211 may flow from the drain to the source, for reset.

FIG. 12 illustrates the unit pattern 1210 which directly charges a capacitor 1212, instead of parasitic capacitance.

Specifically, the unit pattern 1210 may directly charge the capacitor 1212 coupled to a source follower with photocurrent generated from the TFT photodetector 1211.

In the embodiment of FIG. 12, the use of the capacitor 1212 may lead to larger capacitance than parasitic capacitance. Further, the large capacitance may be controlled to obtain a larger dynamic-range output characteristic.

Photocurrent obtained by photo-electric conversion in the TFT photodetector 1211 may be charged in the capacitor 1212 of an IVC circuit inside a pixel due to turn-on of the selection transistor M1.

Further, the photocurrent charged in the capacitor 1212 may be converted into a voltage and output as IVC_OUT, which may be delivered in the form of a signal to a separate driving circuit such as CDS.

The transmitted signal may be reset by the selection transistor M1.

For example, when BUS_RST (M2) is turned on in the turn-on state of the selection transistor M1, charges may be removed from the capacitor 1212, an entire column bus, and the TFT photodetector 1211 of the IVC circuit through a ground GND.

When the unit patterns 1110 and 1210 are used, a light source of a display may also be used as a light source of a touch sensor. In addition, both of a BLU of an LCD and a light emitting source of an OLED may be used. Further, it is possible to detect light in the wavelength band of a near-infrared area which is longer than a maximum wavelength 1150 nm detectable in general silicon.

Figure 13:
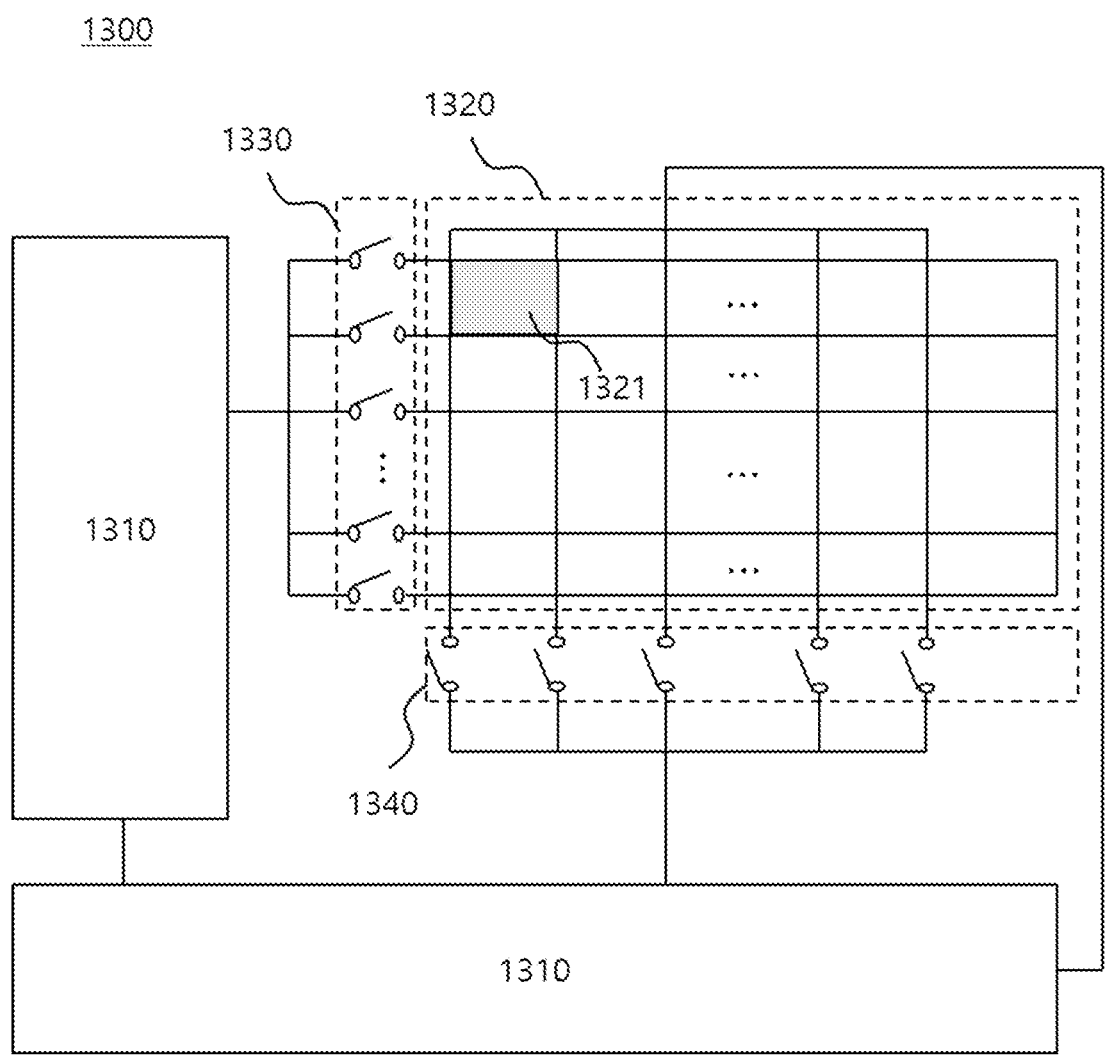
FIG. 13 is a diagram illustrating a touch screen panel according to an embodiment of the disclosure.
Figure 14:
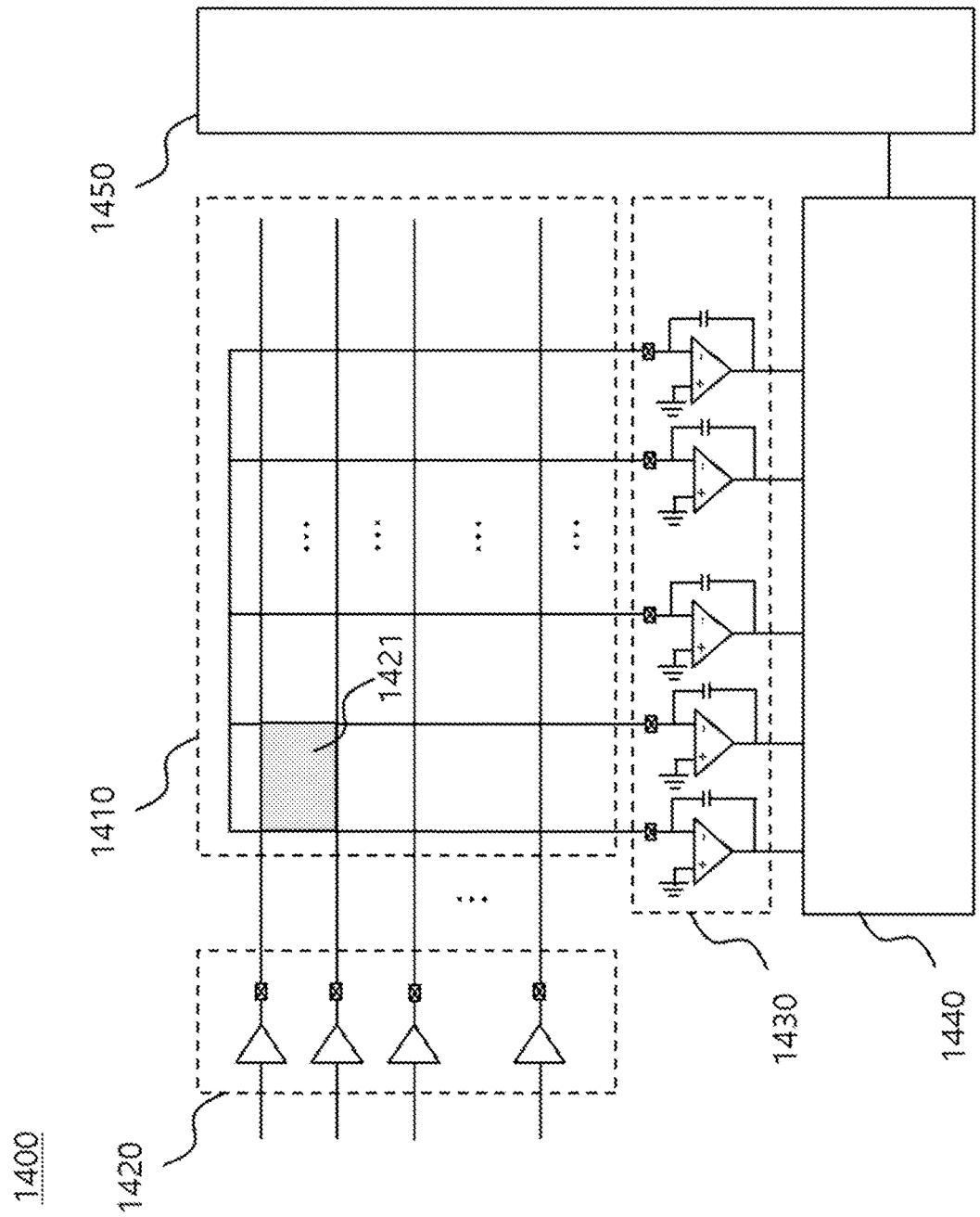
FIG. 14 is a diagram illustrating a touch screen panel according to another embodiment of the disclosure.

With reference to FIGS. 13 and 14, the structure and operation of the touch screen panel will be described in detail in specific embodiments.

FIG. 13 is a diagram illustrating a touch screen panel 1300 according to an embodiment of the disclosure.

According to an embodiment, the touch screen panel 1300 may include a touch panel 1320 with at least one unit pattern 1321 which detects light reflected by a touch by using a TFT photodetector having an active layer formed of a-Si or poly-Si on an amorphous transparent material, and a controller 1310 which scans the at least one unit pattern 1321 and reads touch coordinates as a result of the scanning.

More specifically, the touch panel 1320 may include a plurality of first unit patterns arranged in rows and a plurality of second unit patterns arranged in columns.

For example, the first unit patterns may refer to sets of unit patterns grouped in a row direction, for row-wise line scanning.

The second unit patterns may refer to sets of unit patterns grouped in a column direction, for column-wise line scanning.

Therefore, a unit pattern 1321 may be included in the first unit patterns and the second unit patterns.

That is, the touch panel 1320 includes the plurality of first unit patterns arranged in parallel to each other in a first direction (e.g., X direction) and the plurality of second unit patterns arranged in parallel to each other in a second direction (e.g., Y direction) that crosses the first direction.

The controller 1310 may sequentially scan the row-wise first unit patterns row by row by sequentially supplying a high-potential power voltage to the first unit patterns arranged in the row direction on the touch panel 1320.

Further, the controller 1310 may float the other row-wise unit patterns except for row-wise unit patterns to which the power voltage is currently applied.

In the floating state, a current path between the unit patterns and a voltage source is opened. Therefore, no external voltage is applied to the unit patterns in the floating state. The controller 1310 may further include horizontal line control switches 1330 which supply a high-potential power voltage to the first unit patterns, respectively. Although the horizontal line control switches 1330 are shown as formed between the controller 1310 and the touch panel 1320 in FIG. 13, those skilled in the art will appreciate that the horizontal line control switches 1330 may be modified to be included in the controller 1310 or the touch panel 1320.

The controller 1310 may scan the second unit patterns by sequentially supplying a power voltage to the column-wise second unit patterns after the row-wise first unit patterns are fully scanned line by line.

Similarly to the operation for the row-wise unit patterns, the other column-wise unit patterns except for column-wise unit patterns charged with the high-potential power voltage may be floated.

The controller 1310 according to an embodiment of the disclosure may further include vertical line control switches 1340 which supply a high-potential power voltage to the second unit patterns, respectively.

Referring to FIG. 13, upon occurrence of a touch in a first unit pattern 1321 when a first horizontal line control switch and a first vertical line control switch are turned on, the capacitance of the first unit pattern 1321 may be changed.

When the unit pattern 1321 uses parasitic capacitance generated in the manner illustrated in FIG. 9, conversion to a voltage output may be performed by the parasitic capacitance charged according to the touch.

When the additional capacitor 1012 is used as illustrated in FIG. 10, a touch may be sensed using capacitance larger than the parasitic capacitance. In this case, a larger dynamic range output characteristic may be obtained than in the case of using parasitic capacitance.

The controller 1310 may generate scanning control signals for driving the touch panel 1320.

Further, the controller 1310 may be coupled to the first unit patterns and the second unit patterns of the touch panel 1320, differentially amplify a voltage of initial capacitance of the unit patterns and a voltage of touch capacitance of the unit patterns, and convert the differential amplification result into digital data.

Further, the controller 1310 may determine a touch position based on the difference between the initial capacitance and the touch capacitance by a touch recognition algorithm, and may output touch coordinate data indicating the touch position.

FIG. 14 illustrates a touch screen panel according to another embodiment of the disclosure.

Referring to FIG. 14, a touch screen panel according to an embodiment of the disclosure includes a touch panel 1410, a driver 1420, a detector 1430, a signal converter 1440, and a calculator 1450. The touch panel 1410 may include first unit patterns arranged on a first axis (in an X direction) and second unit patterns arranged on a second axis (in a Y direction).

The capacitance of a unit pattern 1421 at the intersection between a first unit pattern and a second unit pattern may be changed. The capacitance change may be a change in mutual capacitance generated by a driving signal applied to the first unit pattern by the driver 1420. The driver 1420, the detector 1430, the signal converter 1440, and the calculator 1450 may be collectively interpreted as a controller and may be implemented into one integrated circuit (IC).

The driver 1420 may apply a predetermined driving signal to the first unit patterns on the touch panel 1410. The driving signal may be a square wave, sine wave, triangle wave, or the like having a predetermined period and amplitude, and may be sequentially applied to each of the plurality of first unit patterns. While circuits for generating and applying a driving signal are shown as connected to the respective individual first unit patterns in FIG. 14, one driving signal generation circuit may be provided to apply a driving signal to each of the plurality of first unit patterns.

The detector 1430 may include an integration circuit for detecting a change in capacitance from a second unit pattern. The integration circuit may include at least one operational amplifier and a capacitor having a predetermined capacitance. An inverting input terminal of the operational amplifier is coupled to the second unit pattern, converts a capacitance change into an analog signal such as a voltage signal, and outputs the analog signal.

When a driving signal is sequentially applied to each of the plurality of first unit patterns, changes in the capacitances of the plurality of second unit patterns may be detected simultaneously. Accordingly, as many integration circuits as the number of the second unit patterns may be provided.

The signal converter 1440 generates a digital signal from an analog signal generated by an integration circuit. For example, the signal converter 440 may measure a time during which the analog signal output in the form of a voltage from the detector 1430 reaches a predetermined reference voltage level, and measure a variation of an analog signal output from a time-to-digital converter (TDC) which converts the time to a digital signal or the detector 1430 for a predetermined time. Further, the signal converter 1440 may include an analog-to-digital converter (ADC) circuit which converts the measurement to a digital signal.

The calculator 1450 may determine a touch input applied to the touch panel 1410 using a digital signal. In an embodiment of the disclosure, the calculator 1450 may determine the number of touch inputs applied to the touch panel 1410, the coordinates of the touch inputs, gestures, and the like.

Figure 15:
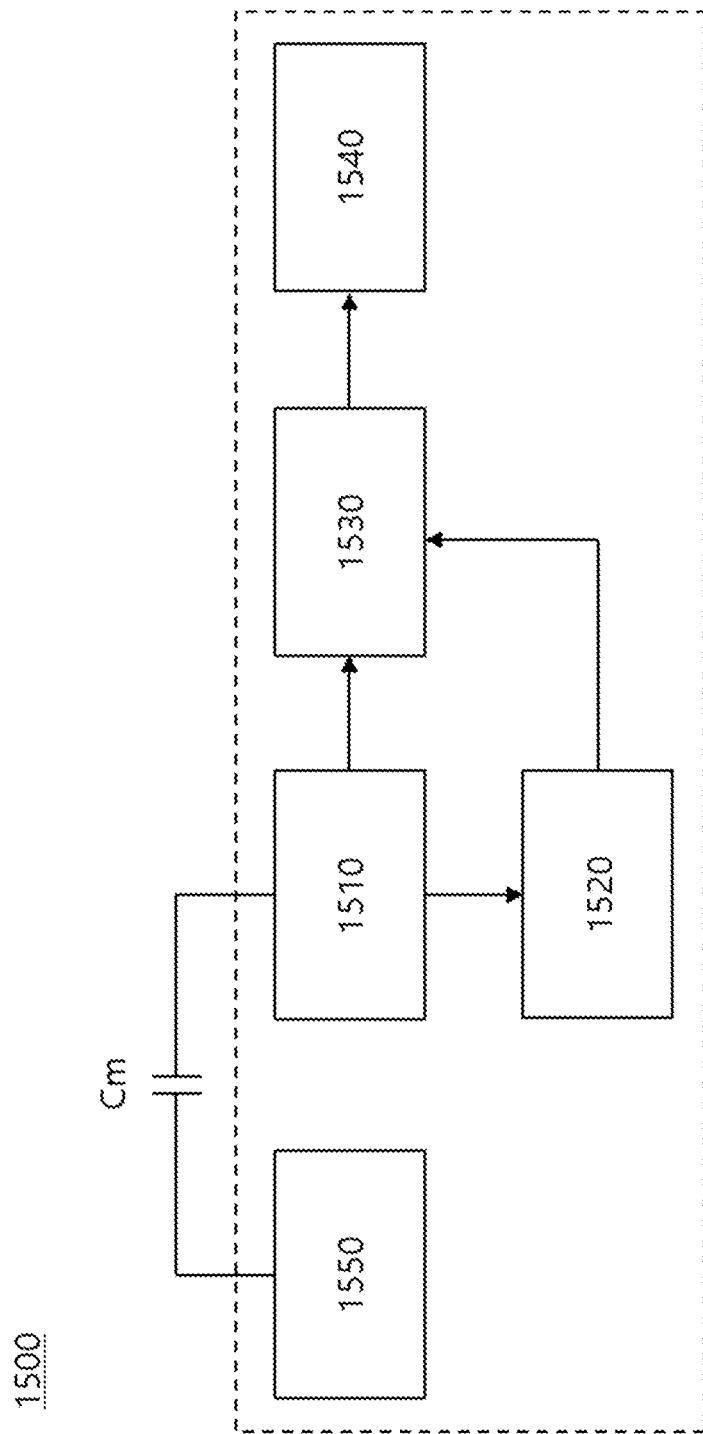
FIG. 15 is a block diagram of a controller according to an embodiment of the disclosure.

FIG. 15 is a block diagram illustrating a controller 1500 according to an embodiment of the disclosure.

Referring to FIG. 15, the controller 1500 according to an embodiment of the disclosure may include a first integration processor 1510, a comparator 1520, and a noise canceller 1530.

According to another embodiment of the disclosure, the controller 1500 may further include a second integration processor 1540 and a driver 1550.

In FIG. 15, a capacitor Cm corresponds to a capacitor charged with capacitance that the controller 1500 wants to measure.

For example, the capacitance of the capacitor Cm may be interpreted as mutual capacitance generated between a plurality of electrodes included in a capacitive touch screen.

The capacitor Cm may be assumed to be a node capacitor which is charged or discharged by a change in mutual capacitance generated at the intersection between the plurality of electrodes.

The first integration processor 1510 may include a first capacitor charged or discharged by the capacitor Cm.

The first capacitor may be coupled to the capacitor Cm by an integration circuit including an operational amplifier OP-AMP, and may be charged by receiving charge from the capacitor Cm.

The first integration processor 1510 may output a voltage corresponding to the charge of the first capacitor. The output voltage of the first integration processor 1510 is input to the comparator 1520 and the noise canceller 1530. The comparator 1520 may compare the level of the voltage signal output from the first integration processor 1510 with a reference level, and transmit the comparison result to the noise canceller 1530.

The noise canceller 1530 may remove the influence of noise included in the output voltage of the first integration processor 1510 according to the result of comparing the output voltage level of the first integration processor 1510 with the reference level.

The output voltage of the first integration processor 1510 from which the influence of noise has been removed by the comparator 1520 and the noise canceller 1530 is provided to the second integration processor 1540. The overall configuration of the second integration processor 1540 is similar to that of the first integration processor 1510. That is, the second integration processor 1540 may include a second capacitor charged or discharged by an output voltage of the first integration processor 1510, and generate an output signal determined by the amount of charge in the second capacitor.

When the controller 1500 according to the present embodiment is applied to a capacitive touch screen, the output signal of the second integration processor 1540 may be input to an ADC and converted into a digital signal in the ADC. The digital signal converted by the ADC may be used as sensing data based on which a calculator determines a touch input.

Figure 16:
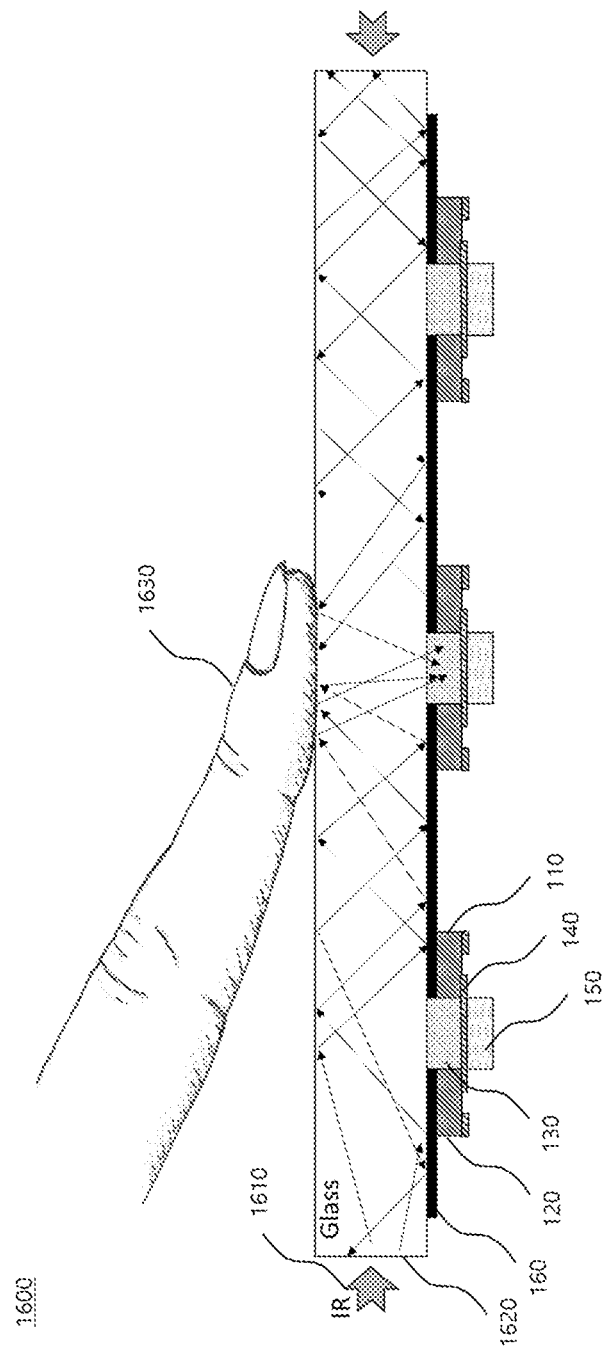
FIG. 16 is a diagram illustrating a touch panel which processes touch recognition by using an infrared (IR) light source.

FIG. 16 is a diagram 1600 illustrating a touch panel that processes touch recognition using an infrared (IR) light source.

The touch panel may include display pixels that emit light and a touch panel that collects light. The touch panel may further include a processor that processes touch recognition along with positioning of a body according to the light collected by the touch panel In the present embodiment, the disclosure will be described in detail, centering on a touch panel which substantially serve as a touch panel and a transparent material.

A touch panel and a display pixel may be arranged side by side on the same layer or may overlap with each other. Since the touch panel is formed on a transparent material, stacking the touch panel on the display pixel does not make a big visual difference.

A touch panel and a display pixel may be included together in a unit pixel to form one pixel of the touch panel. The touch panel may include a TFT photodetector having an active layer formed of a-Si or poly-Si on an amorphous transparent material, and collect light reflected from a body located on the transparent material.

In the case of an IR-based optical touch screen, use of a TFT photodetector-based image sensor very sensitive to IR rays in the manner illustrated in FIG. 16 enables simultaneous recognition of the fingerprint and vein of a finger.

When the finger touches IR light penetrating through glass 1620, the IR light reflected from the finger is incident on the cells of TFT photodetectors distributed in a corresponding area, and signals from the cells are acquired as an image based on which the fingerprint may be recognized. Because the vein of the finger may also be acquired at the same time by external light or the reflected IR light, a very high level of security may be guaranteed.

Particularly, the disclosure is characterized in that a unit cell capable of securing an image is distributed in each pixel on a whole surface of the display, so that a fingerprint and a vein may be recognized from the whole surface of the display, instead of a specific position on the display. That is, the problem of additionally disposing a fingerprint recognition sensor and using it overlapped with the display panel may be simply overcome, and the touch screen function may also be used together. Therefore, a touch panel which is thinner and cheaper than a conventional touch panel may be fabricated.

A TFT photodetector according to an embodiment of the disclosure is formed on the glass 1620 being a transparent material, such as an amorphous glass substrate or a flexible substrate.

For better understanding, the disclosure will be described in the context of the amorphous glass 1620 as a transparent material.

The TFT photodetector includes, on the glass 1620, the gate 150 formed of a-Si or poly-Si, the insulating oxide film 140 capable of controlling tunneling of photo-excited charges, the drain 110, the source 120, and the active layer 130 in which a current channel is to be formed between the source 120 and the drain 110. Although the drain 110, the source 120, the active layer 130, and the gate 150 are formed of a-Si or poly-Si, they may be formed of any other material, as far as the conductive property of the material is controllable by tunneling or an electric field.

An area on which light reflected from the body is incident is confined to the gate 150 serving as the light receiver and the active layer 130 with the insulating oxide film 140 interposed between the active layer 130 and the gate 150. For this purpose, the metal protection layer 160 may be formed on a boundary surface of the transparent substrate, except for the area between the transparent substrate and the active layer 130, to shield unnecessary light introduced into the TFT photodetector 100 through the glass 1620. The metal shielding layer 170 may be formed in the remaining area except for the gate 150 in the upper part of the TFT photodetector. The shielding layer 170 may be formed by a silicide and metal process. The TFT photodetector limits an area on which light is incident to the gate 150 serving as the light receiver by means of the shielding layer 170, thereby maximizing the photoelectric conversion in the gate 150.

When IR light is irradiated from an IR light source 1610, the IR light is reflected back from a body 1630 and then used for touch recognition.

The IR light source 1610 may irradiate IR light from one side of the glass 1620 being a transparent material to cause diffused reflection in the glass 1620.

The touch panel may collect IR light which has been diffusedly reflected from the body contacting the glass 1620.

The processor may process touch recognition together with positioning of the body 1630 from the light which has been generated by the IR light source 1610 and then collected.

For example, the processor may identify information about at least one of a vein, a fingerprint, or a face based on the light reflected from the body 1630, and process touch recognition by comparing the identified information with pre-stored information.

The body 1630 is a part from which uniquely identifiable biometric information may be acquired, and may be interpreted as the tip of a finger, a palm, or the like from which a fingerprint may be acquired.

Further, the processor may process touch recognition along with positioning of the body 1630 according to light reflected from the body 1630.

With reference to FIG. 16, the embodiment in which after the IR light source irradiates IR light from one side of a touch panel, the IR light is reflected from the body 1630 during diffused reflection in the glass 1620 and collected by the TFT photodetector, and touch recognition is processed based on the reflected light by the processor has been described above.

Figure 17:
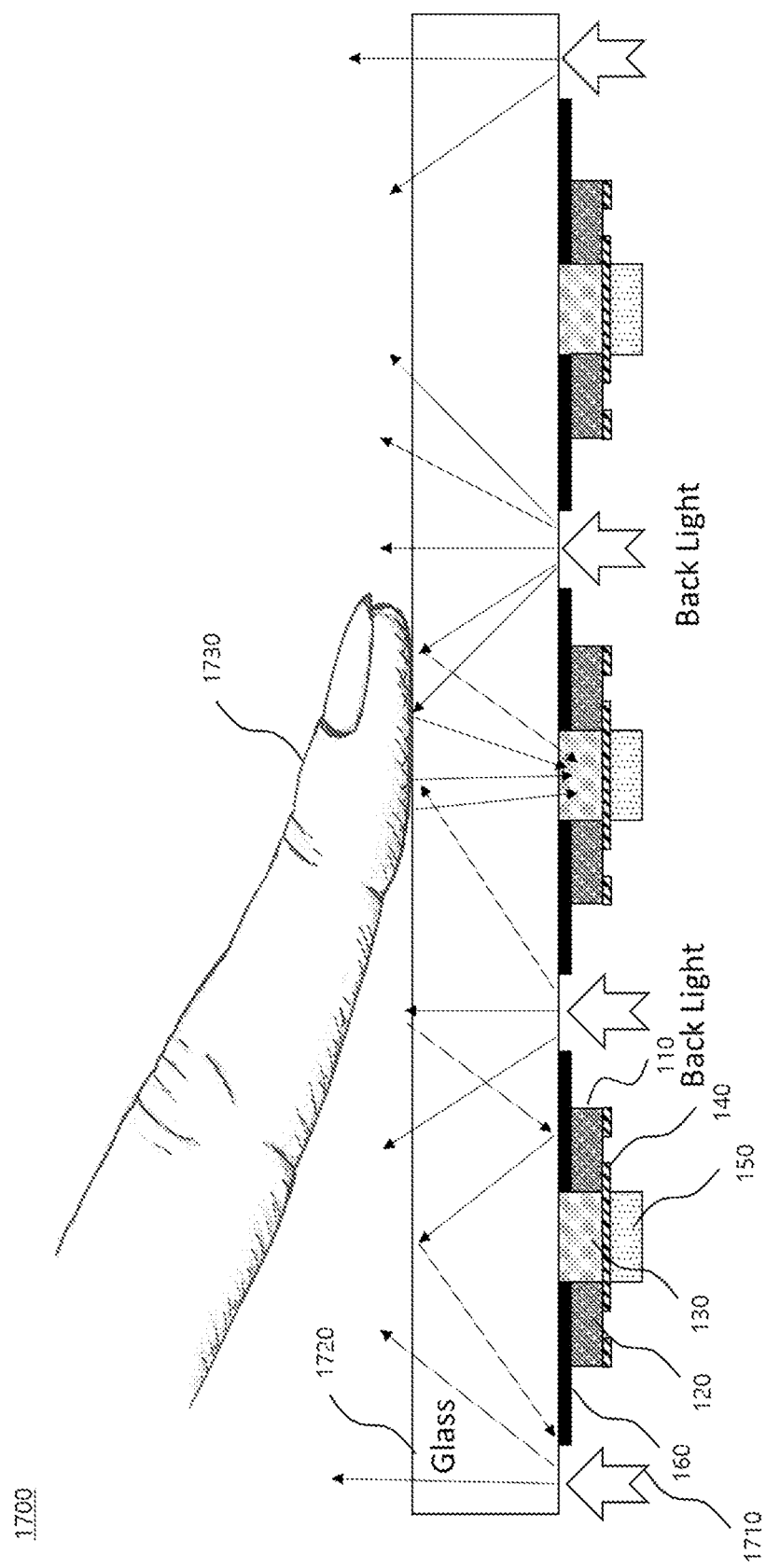
FIG. 17 is a diagram illustrating a touch panel which processes touch recognition by using a backlight light source.

FIG. 17 illustrates an embodiment 1700 of using a backlight light source instead of an IR light source.

In FIG. 17, a touch panel that processes touch recognition using a backlight as a light source is illustrated.

A backlight light source 1710 may be used as a light source for the TFT photodetector.

The backlight light source 1710 may irradiate backlights in a transmission direction of the transparent material through a space between adjacent TFT photodetectors.

As illustrated in FIG. 17, the metal protection layer 160 for blocking light is formed on a boundary surface of glass 1720 being a transparent material except for an area between the glass 1720 and the active layer 130, to block the introduction of unnecessary light into the TFT photodetector through the glass 1720.

The touch panel may collect light which has passed through the glass 1720 and then reflected from the body, and the processor may process touch recognition together with positioning of the body from the light which has been generated by the backlight light source and then collected. Particularly, the processor may process touch recognition together with positioning of the body from light which has been generated by the backlight light source, reflected from the body contacting the transparent material, and then collected.

For example, the processor may identify information about at least one of a vein, a fingerprint, or a face based on the light reflected from the body, and process touch recognition by comparing the identified information with pre-stored information, for the display panel.

Use of the backlight light source 1710 as a light source for the TFT photodetector enables simultaneous recognition of the fingerprint and vein of a finger. When the finger touches backlight penetrating through the glass 1720, the backlight reflected from the finger is incident on the cells of TFT photodetectors distributed in a corresponding area, and signals from the cells are acquired as an image based on which the fingerprint may be recognized. Because the vein of the finger may also be acquired at the same time by external light or backlight, a very high level of security may be guaranteed.

Further, the disclosure is characterized in that a unit cell capable of securing an image is distributed in each pixel on a whole surface of the display, so that a fingerprint and a vein may be recognized from the whole surface of the display, instead of a specific position on the display. That is, the problem of additionally disposing a fingerprint recognition sensor and using it overlapped with the touch panel may be simply overcome, and the touch screen function may also be used together. Therefore, a touch panel which is thinner and cheaper than a conventional touch panel may be fabricated.

As a result, according to the disclosure, a highly sensitive touch panel may be implemented on a glass substrate or a flexible substrate such as a polyimide film, used as a touch panel by the TFT fabrication technology.

Besides, since a light emitting device or a BLU of the display is used as a light source for a touch panel, touch sensing may be processed without using a separate light emitter required for the touch panel according to the disclosure.

As is apparent from the foregoing description of various embodiments of the disclosure, a high-sensitivity touch panel may be implemented on a glass substrate or a flexible substrate such as a polyimide film, which is used as a touch panel, by a TFT fabrication technology.

According to an embodiment of the disclosure, touch recognition may be processed fast and accurately using a touch screen panel having a display pixel and a touch panel integrated thereon.

According to an embodiment of the disclosure, touch sensing may be processed without the need for separately providing a light emitter for a touch panel, by using a light emitting device or BLU of a display as a light source for the touch panel.

According to an embodiment of the disclosure, a transparent touch panel capable of displaying and touch sensing may be implemented by vertically stacking a display panel and a touch panel or arranging the display panel and the touch panel on the same panel.

According to an embodiment of the disclosure, a switching TFT for display and a driving TFT for image sensing may be fabricated in a single process by arranging a display panel and a touch panel on the same panel.

According to an embodiment of the disclosure, a light source for a display may also be used as a light source for a touch panel.

According to an embodiment of the disclosure, both of a BLU of an LCD and a light emitting source of an OLED may be used.

According to an embodiment of the disclosure, it is possible to detect light in the wavelength band of a near-IR area longer than a maximum detectable wavelength, 1150 nms in general silicon.

The above description is merely illustrative of the technical idea of the disclosure, and those skilled in the art may make various modifications and changes without departing from the essential features of the disclosure. In addition, the embodiments disclosed herein are intended to describe the disclosure, not limiting the technical spirit of the disclosure, and the scope of the technical idea of the disclosure is not limited by these embodiments. Therefore, the protection scope of the disclosure should be interpreted by the appended claims, and all technical ideas within their equivalency should be construed as being embraced in the scope of the disclosure.

What is claimed is:

1. A touch screen panel using a thin film transistor (TFT) photodetector, the touch screen panel comprising:
   a touch panel including a plurality of unit patterns for sensing light reflected by a touch by using a TFT photodetector including an active layer formed of amorphous silicon or polycrystalline silicon on an amorphous transparent material; and
   a controller configured to scan the plurality of unit patterns and read touch coordinates as a result of the scanning,
   wherein the TFT photodetector is formed in a structure in which when light is incident, electrons migrate into a gate by tunneling from the active layer to an oxide film, among charges excited with the oxide film in between.

2. The touch screen panel according to claim 1, wherein the electron migration changes a threshold voltage of a current channel between a source and a drain in correspondence with a change in a total amount of charge in the gate, photocurrent proportional to the intensity of the incident light flows in the active layer, and a voltage output is generated from the flowing photocurrent.

3. The touch screen panel according to claim 1, wherein the plurality of unit patterns comprise a plurality of first unit patterns which are arranged in parallel with each other in a first direction, and a plurality of second unit patterns which are arranged in parallel with each other in a second direction crossing the first direction, insulated from the plurality of first unit patterns.

4. The touch screen panel according to claim 3, wherein the controller is configured to:
   scan each of the plurality of first unit patterns by supplying a first voltage to the plurality of first unit patterns in line by line manner;
   scan all of the plurality of second unit patterns by sequentially supplying the first voltage to the plurality of second unit patterns according to a first scanning control signal, each time each of the plurality of first unit patterns is scanned; and
   connect to the plurality of first and second unit patterns of the touch panel and detect a touch recognition signal indicating whether a touch has occurred, and a touch position by comparing a voltage of initial capacitance of each of the plurality of first and second unit patterns with a voltage of current capacitance of the unit pattern, each time the first voltage is supplied to the plurality of first unit patterns and the plurality of second unit patterns by a driving circuit.

5. The touch screen panel according to claim 3, wherein the controller comprises a first driving circuit configured to scan the plurality of first unit patterns by supplying the first voltage to the plurality of first unit patterns, and a second driving circuit configured to scan the plurality of second unit patterns by supplying the first voltage to the plurality of second unit patterns,
   wherein the first driving circuit comprises a plurality of first control switches configured to respectively supply the first voltage to the plurality of first unit patterns in response to a first scanning control signal and a second scanning signal from the controller, and a plurality of second control switches configured to respectively supply the first voltage to the plurality of second unit patterns in response to the first scanning control signal and the second scanning signal from the controller.

6. The touch screen panel according to claim 1, wherein the controller comprises:
   a first integration processor including a first capacitor charged by a capacitance variation in the plurality of first unit patterns; and
   a comparator configured to compare a level of an output signal of the first integration processor with a predetermined reference level,
   wherein when the level of the output signal of the first integration processor is higher than the reference level, the comparator controls each of the plurality of switches to discharge the first capacitor.

7. The touch screen panel according to claim 6, wherein the controller further comprises:
   a second integration processor including a second capacitor charged by the charged first capacitor; and
   a calculator configured to determine a touch input from an output signal of the second integration processor.

8. The touch screen panel according to claim 7, wherein the controller further comprising a noise canceller including a plurality of switches operating according to an output of the comparator,
   wherein the noise canceller comprises a first switch connected to a ground and a second switch connected to an input node of the second integration processor, and
   wherein when the level of the output signal of the first integration processor is higher than the reference level, the comparator is configured to turn off the second switch and turn on the first switch.

9. The touch screen panel according to claim 6, wherein the comparator comprises:
   a first comparison circuit configured to compare the level of the output signal of the first integration processor with a first reference level; and
   a second comparison circuit configured to compare the level of the output signal of the first integration processor with a second reference level, and
   wherein when the level of the output signal of the first integration processor is higher than the first reference level or lower than the second reference level, the comparator operates each of the plurality of switches to discharge the first capacitor.

10. The touch screen panel according to claim 1, wherein the touch panel further comprises an infrared (IR) light source configured to cause diffused reflection on the transparent material by irradiating IR light from one side of the transparent material, and
   wherein the plurality of unit patterns collect the IR light diffusedly reflected from a body contacting the transparent material, and the controller processes touch recognition along with positioning of the body by the light generated from the IR light source and then collected.

11. The touch screen panel according to claim 1, wherein the touch panel further comprises a backlight light source configured to irradiate backlight in a transmission direction of the transparent material through a space between adjacent TFT photodetector, and
   wherein the plurality of unit patterns collect the backlight passed through the transparent material and then reflected back from the body, and the controller processes touch recognition along with the positioning of the body by the light generated from the backlight light source and then collected.

12. The touch screen panel according to claim 1, wherein the TFT photodetector is electrically coupled to at least one transistor and the at least one transistor is configured to generate a voltage output from photocurrent generated in the active layer.

13. The touch screen panel according to claim 1, wherein the active layer includes a material having a conductive property controllable by tunneling or an electric field.

14. The touch screen panel according to claim 1, wherein the TFT photodetector uses light generated from a display panel as a light source for the plurality of unit patterns.

15. A touch screen panel using a thin film transistor (TFT) photodetector, the touch screen panel comprising:
   a touch panel including a plurality of unit patterns for sensing light reflected by a touch by using a TFT photodetector including a source, a drain and an active layer formed of amorphous silicon or polycrystalline silicon on an amorphous transparent material; and
   a controller configured to scan the plurality of unit patterns and read touch coordinates as a result of the scanning,
   wherein the active layer is formed between the source and the drain and including a current channel formed between the source and the drain.

16. The touch screen panel according to claim 15, wherein the TFT photodetector further comprises:
   an insulating oxide film formed on the source, the drain, and the active layer; and
   a light receiver formed on the insulating oxide film, configured to absorb light, and insulated from the active layer by the insulating oxide film.

17. The touch screen panel according to claim 16, wherein in the TFT photodetector, when light is incident on the light receiver, electrons migrate by tunneling through the insulating oxide film between the light receiver and the active layer excited with the insulating oxide film in between, the electron migration changes an amount of charge in the light receiver, the changed amount of charge changes a threshold voltage of the current channel, and thus photocurrent flows in the current channel.

* * * * *